(12) United States Patent
Lee et al.

(10) Patent No.: US 11,967,630 B2
(45) Date of Patent: Apr. 23, 2024

(54) SEMICONDUCTOR DEVICE INCLUDING WORK FUNCTION ADJUSTING METAL GATE STRUCTURE

(71) Applicant: Samsung Electronics Co., Ltd., Suwon-si (KR)

(72) Inventors: Byoung Hoon Lee, Suwon-si (KR); Wan Don Kim, Seongnam-si (KR); Jong Ho Park, Suwon-si (KR); Sang Jin Hyun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 163 days.

(21) Appl. No.: 17/669,859

(22) Filed: Feb. 11, 2022

(65) Prior Publication Data

US 2022/0165861 A1 May 26, 2022

Related U.S. Application Data

(63) Continuation of application No. 16/269,712, filed on Feb. 7, 2019, now Pat. No. 11,282,939.

(30) Foreign Application Priority Data

Jun. 12, 2018 (KR) ........................ 10-2018-0067146

(51) Int. Cl.
*H01L 29/51* (2006.01)
*H01L 29/423* (2006.01)
(Continued)

(52) U.S. Cl.
CPC ...... *H01L 29/511* (2013.01); *H01L 29/42392* (2013.01); *H01L 29/4966* (2013.01);
(Continued)

(58) Field of Classification Search
CPC ........... H01L 29/42392; H01L 29/0665; H01L 29/0669–068; H01L 29/7853–7856; H01L 2029/7858; H01L 2924/13061; H01L 29/66439; H01L 29/66469; H01L 29/78687; H01L 29/511; H01L 29/78696; H01L 29/4966; H01L 29/518;
(Continued)

(56) References Cited

U.S. PATENT DOCUMENTS 6,069,073 A 5/2000 Kim et al.
6,140,255 A 10/2000 Ngo et al.
(Continued)

FOREIGN PATENT DOCUMENTS

KR 10-1189642 B1 10/2012
KR 10-1656444 B1 9/2016
(Continued)

*Primary Examiner* — Nelson Garces
(74) *Attorney, Agent, or Firm* — Muir Patent Law, PLLC

(57) ABSTRACT

A semiconductor device is provided. The semiconductor device comprising a multi-channel active pattern on a substrate, a high dielectric constant insulating layer formed along the multi-channel active pattern on the multi-channel active pattern, wherein the high dielectric constant insulating layer comprises a metal, a silicon nitride layer formed along the high dielectric constant insulating layer on the high dielectric constant insulating layer and a gate electrode on the silicon nitride layer.

20 Claims, 45 Drawing Sheets

(51) Int. Cl.
  *H01L 29/49* (2006.01)
  *H01L 29/775* (2006.01)
  *H01L 29/786* (2006.01)

(52) U.S. Cl.
  CPC .......... *H01L 29/518* (2013.01); *H01L 29/775* (2013.01); *H01L 29/78696* (2013.01)

(58) Field of Classification Search
  CPC . H01L 29/775; H01L 29/0653; H01L 29/401; H01L 29/513; Y10S 977/938; B82Y 10/00
  See application file for complete search history.

(56) References Cited

U.S. PATENT DOCUMENTS

| | | |
|---|---|---|
| 7,071,086 B2 | 7/2006 | Woo et al. |
| 9,082,702 B2 | 7/2015 | Lei et al. |
| 9,159,608 B2 | 10/2015 | Park et al. |
| 9,287,199 B2 | 3/2016 | Lee et al. |
| 9,337,057 B2 | 5/2016 | Park et al. |
| 9,543,300 B2 | 1/2017 | Lee et al. |
| 9,659,937 B2 | 8/2017 | Kang |
| 2017/0110324 A1 | 4/2017 | Tsai et al. |
| 2017/0110542 A1 | 4/2017 | Lee et al. |
| 2017/0110550 A1 | 4/2017 | Tsai et al. |
| 2017/0110552 A1 | 4/2017 | Lee et al. |
| 2017/0200738 A1* | 7/2017 | Kim .................. H01L 29/66439 |
| 2018/0130905 A1* | 5/2018 | Chung .................. H01L 21/283 |
| 2019/0214473 A1 | 7/2019 | Xie et al. |
| 2019/0371888 A1* | 12/2019 | Zhang ............... H01L 21/02532 |

FOREIGN PATENT DOCUMENTS

| | | |
|---|---|---|
| KR | 1020170050411 A | 5/2017 |
| WO | 2013/153031 A1 | 10/2013 |

* cited by examiner

SEMICONDUCTOR DEVICE INCLUDING WORK FUNCTION ADJUSTING METAL GATE STRUCTURE

CROSS-REFERENCE TO RELATED APPLICATION(S)

This application is a Continuation of U.S. patent application Ser. No. 16/269,712 filed on Feb. 7, 2019, now Allowed, which claims priority under 35 USC § 119 to Korean Patent Application No. 10-2018-0067146 filed on Jun. 12, 2018, in the Korean Intellectual Property Office, the disclosure of each of which is incorporated herein by reference in its entirety.

FIELD

The present inventive concept relates to a semiconductor device, and more specifically, to a semiconductor device which uses a multi-channel active pattern as a channel region.

BACKGROUND

As one of scaling techniques for increasing density of a semiconductor device, a gate-all-around structure in which a nanowire-shaped silicon body is formed on a substrate and a gate is formed to surround the silicon body has been proposed.

Since such a gate-all-around structure uses three-dimensional channels, scaling is easily performed. Further, the current control capability may be improved, without increasing the length of the gate. Furthermore, it is possible to effectively suppress a SCE (short channel effect) in which the potential of the channel region is affected by the drain voltage.

SUMMARY

Aspects of the present inventive concept provide a semiconductor device with improved performance and reliability by improving interfacial characteristics of a gate insulating layer.

The aspects of the present inventive concept are not restricted to those mentioned above and another aspect which is not mentioned may be clearly understood by those skilled in the art from the description below.

According to some embodiments of the present inventive concept, provided is a semiconductor device including: a multi-channel active pattern on a substrate; a high dielectric constant insulating layer formed along the multi-channel active pattern on the multi-channel active pattern, wherein the high dielectric constant insulating layer includes a metal; a silicon nitride layer formed along the high dielectric constant insulating layer on the high dielectric constant insulating layer; and a gate electrode on the silicon nitride layer.

According to some embodiments of the present inventive concept, provided is a semiconductor device including: a multi-channel active pattern on a substrate; a gate insulating layer formed along the multi-channel active pattern on the multi-channel active pattern, wherein the gate insulating layer includes a boundary layer and a high dielectric constant insulating layer; and a gate electrode structure on the gate insulating layer, wherein the gate electrode structure includes a work function adjusting liner which is in contact with the gate insulating layer, a dielectric constant of the work function adjusting liner is less than a dielectric constant of the high dielectric constant insulating layer, and a thickness of the work function adjusting liner is less than a thickness of the high dielectric constant insulating layer.

According to some embodiments of the present inventive concept, provided is a semiconductor device including: a first nanowire on a substrate; a second nanowire spaced apart from the first nanowire on the first nanowire; a gate insulating layer formed along a periphery of the first nanowire and a periphery of the second nanowire on the first nanowire and the second nanowire, wherein the gate insulating layer includes a metal; a silicon nitride layer formed along the periphery of the first nanowire and the periphery of the second nanowire on the gate insulating layer and being in contact with the gate insulating layer; and a gate electrode which includes a conductive liner containing titanium on the silicon nitride layer, the conductive liner including a gate electrode formed along the periphery of the first nanowire and the periphery of the second nanowire.

According to some embodiments of the present inventive concept, provided is a semiconductor device including: a substrate including a first region and a second region; a first multi-channel active pattern on the substrate in the first region; a first high dielectric constant insulating layer formed along the first multi-channel active pattern on the first multi-channel active pattern, wherein the first high dielectric constant insulating layer includes a metal; a first gate electrode structure including a first silicon nitride layer and a first conductive liner, the first silicon nitride layer and the first conductive liner are formed along the first high dielectric constant insulating layer on the first high dielectric constant insulating layer, the first conductive liner being disposed on the first silicon nitride layer; a second multi-channel active pattern on the substrate in the second region; a second high dielectric constant insulating layer formed along the second multi-channel active pattern on the second multi-channel active pattern, wherein the second high dielectric constant insulating layer includes a metal; and a second gate electrode structure including a second conductive liner formed along the second high dielectric constant insulating layer on the second high dielectric constant insulating layer.

According to some embodiments of the present inventive concept, provided is a semiconductor device including: a substrate including a first region and a second region; a first multi-channel active pattern on the substrate in the first region; a first high dielectric constant insulating layer formed along the first multi-channel active pattern on the first multi-channel active pattern, wherein the first high dielectric constant insulating layer includes a metal; a first gate electrode structure including a first silicon nitride layer and a first conductive liner, the first silicon nitride layer and the first conductive liner are formed along the first high dielectric constant insulating layer on the first high dielectric constant insulating layer, the first conductive liner being disposed on the first silicon nitride layer; a second multi-channel active pattern on the substrate in the second region; a second high dielectric constant insulating layer formed along the second multi-channel active pattern on the second multi-channel active pattern, wherein the second high dielectric constant insulating layer includes a metal; and a second gate electrode structure including a second silicon nitride layer and a second conductive liner, the second silicon nitride layer and the second conductive liner are formed along the second high dielectric constant insulating layer on the second high dielectric constant insulating layer, the second conductive liner being disposed on the second silicon nitride layer, and a structure of the second conductive liner being different from a structure of the first conductive liner.

According to some embodiments of the present inventive concept, provided is a semiconductor device semiconductor device comprising: a first p-type transistor formed in a first region of a substrate and having a first threshold voltage; and a second p-type transistor formed in a second region of the substrate and having a second threshold voltage less than the first threshold voltage, wherein the first p-type transistor includes: first and second nanowires sequentially disposed on the substrate, a first gate insulating layer formed along a periphery of the first nanowire and a periphery of the second nanowire, and a first gate electrode which surrounds the first nanowire and the second nanowire on the first gate insulating layer, wherein the first gate electrode includes a first titanium nitride layer and a first titanium silicon nitride layer sequentially formed along the periphery of the first nanowire and the periphery of the second nanowire, and a first upper electrode on the first titanium silicon nitride layer, the second p-type transistor includes comprises: third and fourth nanowires sequentially disposed on the substrate; a second gate insulating layer formed along a periphery of the third nanowire and a periphery of the fourth nanowire; and a second gate electrode which surrounds the third nanowire and the fourth nanowire on the second gate insulating layer, wherein the second gate electrode includes a second gate electrode including a second titanium nitride layer and a second titanium silicon nitride layer, wherein the second titanium nitride layer and the second titanium silicon nitride layer are formed along the periphery of the third nanowire and the periphery of the fourth nanowire, and a ratio of a thickness of the first titanium silicon nitride layer to a thickness of the first titanium nitride layer is in a range of about 5/3 to about 7.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
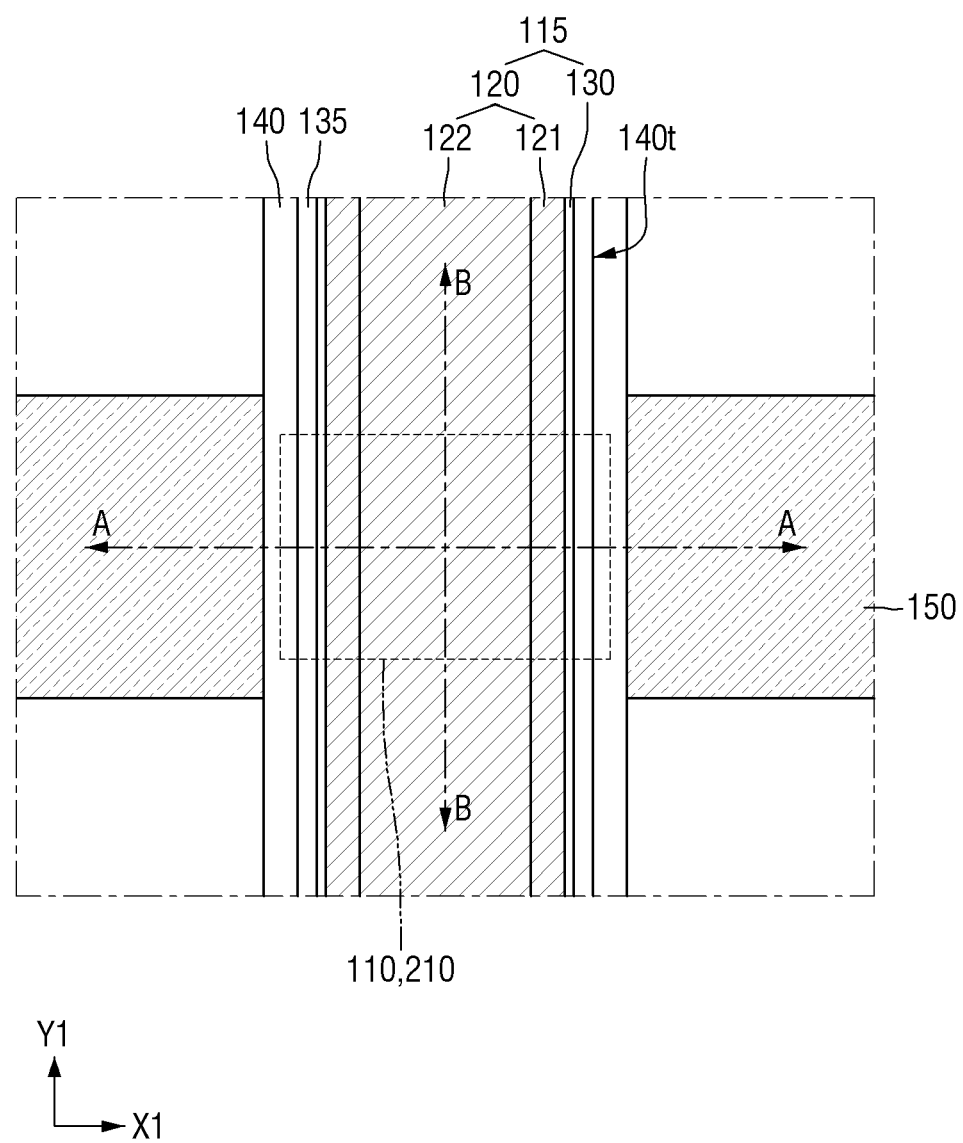
FIGS. 1 to 3 are diagrams for explaining a semiconductor device according to some embodiments of the present inventive concept.

In the drawings of the semiconductor device according to some embodiments of the present inventive concept, a gate-all-around transistor (GAA FET) including a nanowire-shaped or nanosheet-shaped channel region is exemplarily illustrated, but is not limited thereto. The semiconductor device according to some embodiments of the present inventive concept may include a tunneling transistor (FET), a bipolar junction transistor, a lateral double diffused transistor (LDMOS), or the like.

Figure 2:
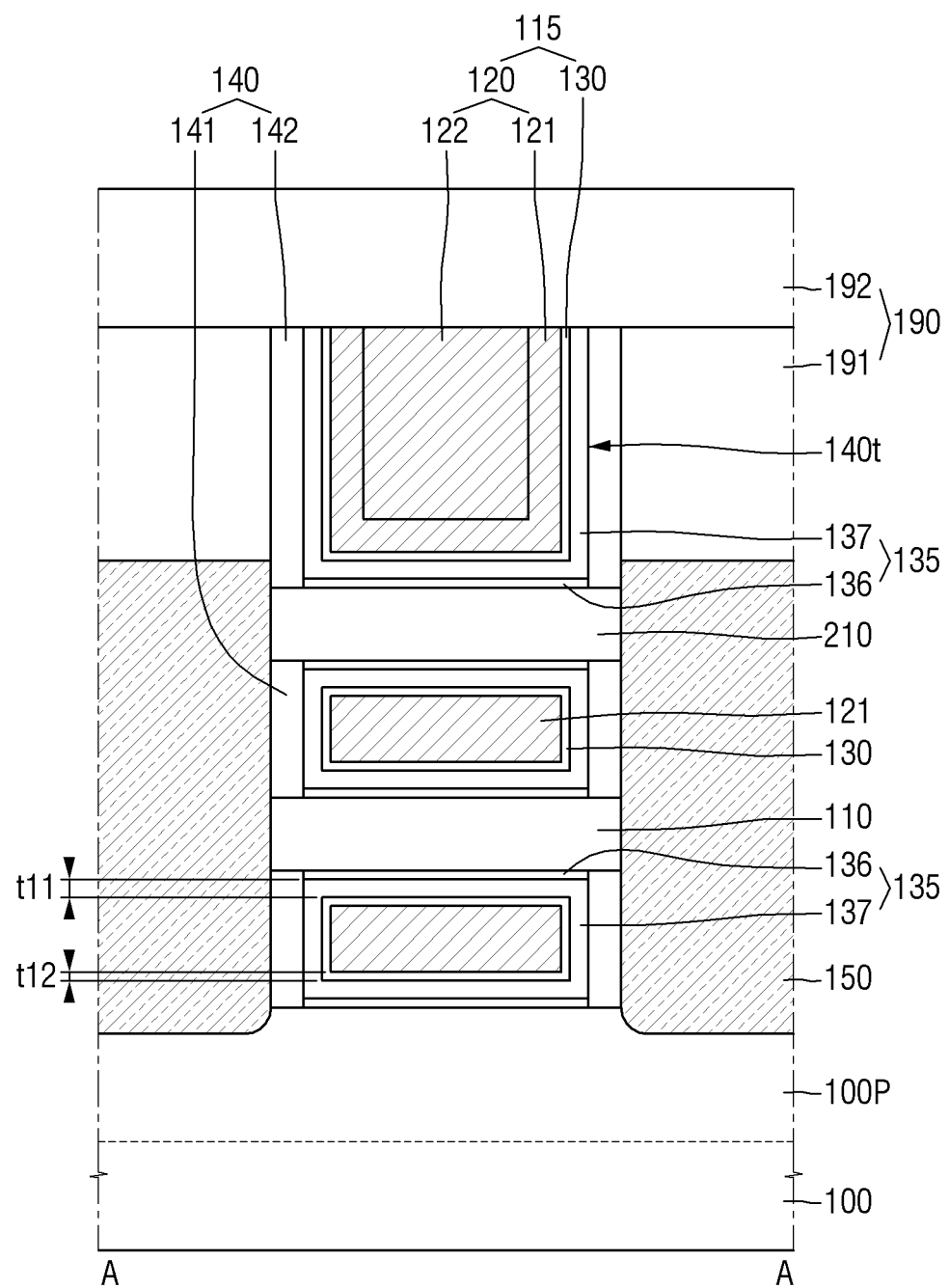
Figure 3:
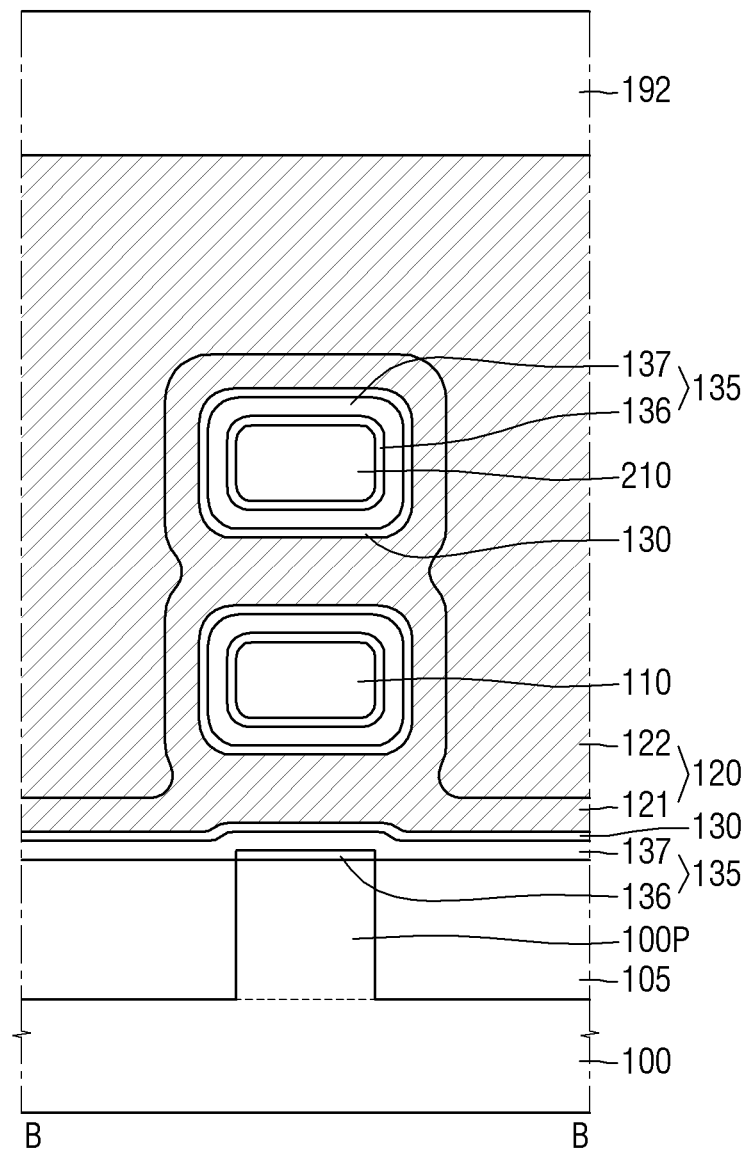

FIGS. 1 to 3 are diagrams for explaining the semiconductor device according to some embodiments of the present inventive concept. FIG. 1 is a plan view for explaining the semiconductor device according to some embodiments of the present inventive concept, and FIGS. 2 and 3 are cross-sectional views taken along lines A-A and B-B of FIG. 1. FIGS. 4A to 4D are various cross-sectional views of the first wire pattern of FIG. 1 taken along B-B. FIGS. 5A to 5C and 6 are various cross-sectional views of the first wire pattern of FIG. 1 taken along A-A. For convenience of explanation, an interlayer insulating layer 190 is not illustrated in FIG. 1.

Referring to FIGS. 1 to 3, the semiconductor device according to some embodiments of the present inventive concept may include a first multi-channel active pattern 110, a second multi-channel active pattern 210, a first gate electrode structure 115, and a first gate insulating layer 135. The first gate electrode structure 115 may include a first work function adjusting liner 130 and a first gate electrode 120.

The substrate 100 may be bulk silicon or silicon-on-insulator (SOI). Alternatively, the substrate 100 may be a silicon substrate or may include, but is not limited to, other materials such as silicon germanium, silicon germanium on insulator (SGOI), indium antimonide, lead tellurium compound, indium arsenide, phosphide indium, gallium arsenide or gallium antimonide.

A first fin-type protrusion 100P may protrude from the substrate 100. The first fin-type protrusion 100P may extend long in a first direction X1. The first fin-type protrusion 100P may be formed by etching a part of the substrate 100, and may include an epitaxial layer grown from the substrate 100.

The first fin-type protrusion 100P may include silicon or germanium which is an element semiconductor material. Further, the first fin-type protrusion 100P may include a compound semiconductor, and may include, for example, a group IV-IV compound semiconductor or a group III-V compound semiconductor. The group IV-IV compound semiconductor may be, for example, a binary compound or a ternary compound including at least two or more of carbon (C), silicon (Si), germanium (Ge) and tin (Sn), or a compound obtained by doping these elements with a group IV element. For example, the group III-V compound semiconductor may be, for example, one of a binary compound, a ternary compound, or a quaternary compound formed by combining at least one of aluminum (Al), gallium (Ga) and indium (In) as a group III element, with one of phosphorus (P), arsenic (As) and antimonium (Sb) as a group V element.

The field insulating layer 105 may be formed on the substrate 100. The field insulating layer 105 may surround at least a part of the side wall of the first fin-type protrusion 100P. The first fin-type protrusion 100P may be defined by the field insulating layer 105. In FIG. 3, the side wall of the first fin-type protrusion 100P is illustrated as being entirely surrounded by the field insulating layer 105, but it is for convenience of explanation and the inventive concept is not limited thereto.

The field insulating layer 105 may include, for example, one of an oxide layer, a nitride layer, an oxynitride layer, or a combination thereof. Further, the field insulating layer 105 may further include at least one field liner layer (not shown) formed between the first fin-type protrusion 100P and the field insulating layer 105. When the field insulating layer 105 further includes the field liner layer, the field liner layer may contain at least one of polysilicon, amorphous silicon, silicon oxynitride, silicon nitride and silicon oxide.

The first and second multi-channel active patterns 110 and 210 may be sequentially formed on the substrate 100. For example, the first and second multi-channel active patterns 110 and 210 may be sequentially disposed on the first fin-type protrusion 100P. In the semiconductor device according to some embodiments of the present inventive concept, a distance in which the first fin-type protrusion 100P and the first multi-channel active pattern 110 are spaced apart from each other in a height direction, may be substantially equal to a distance in which the first multi-channel active pattern 110 and the second multi-channel active pattern 210 are spaced apart from each other in the height direction.

The first and second multi-channel active patterns 110 and 210 may extend in the first direction X1 like the first fin-type protrusion 100P, respectively. The first and second multi-channel active patterns 110 and 210 may be sequentially arranged in the thickness direction of the substrate 100.

The first multi-channel active pattern 110 may be formed to be spaced apart from the substrate 100. For example, the first multi-channel active pattern 110 may be formed to be spaced apart from the first fin-type protrusion 100P. The first multi-channel active pattern 110 may vertically overlap the first fin-type protrusion 100P. The first multi-channel active pattern 110 is not formed on the field insulating layer 105 along the upper surface of the field insulating layer 105 but may be formed on the first fin-type protrusion 100P along the upper surface of the first fin-type protrusion 100P. The second multi-channel active pattern 210 may be formed to be spaced apart from the first multi-channel active pattern 110. Since the first multi-channel active pattern 110 is formed to be spaced apart from the substrate 100 and the first fin-type protrusion 100P, the second multi-channel active pattern 210 may also be formed to be spaced apart from the substrate 100 and the first fin-type protrusion 100P.

The first and second multi-channel active patterns 110 and 210 may include silicon or germanium which is the element semiconductor material, respectively. Further, the first and second multi-channel active patterns 110 and 210 may include compound semiconductors, respectively, and may include, for example, a group IV-IV compound semiconductor or a group III-V compound semiconductor. The first and second multi-channel active patterns 110 and 210 may be used as channel regions of transistors, respectively. Each of the first and second multi-channel active patterns 110 and 210 may include the same material or may include other materials. Each of the first and second multi-channel active patterns 110 and 210 may include the same material as the first fin-type protrusion 100P, and may include the material different from the first fin-type protrusion 100P.

In the semiconductor device according to some embodiments of the present inventive concept, the first and second multi-channel active patterns 110 and 210 may include nanowires. For example, the first multi-channel active pattern 110 may be a first nanowire and the second multi-channel active pattern 210 may be a second nanowire. In the following description, each of the first and second multi-channel active patterns 110 and 210 will be described as a nanowire containing silicon.

In FIGS. 1 to 3, the two multi-channel active patterns 110 and 210 are illustrated as being formed on the substrate 100 so as to be spaced apart from each other, but this is only for convenience of explanation, and the inventive concept is not limited thereto. In other words, one multi-channel active pattern may be formed on the substrate 100, and three or more multi-channel active patterns may be formed on the substrate 100 to be spaced apart from each other.

The first gate spacer 140 may extend in a second direction Y1. The first gate spacer 140 may intersect the first and second multi-channel active patterns 110 and 210. The first gate spacer 140 may define a first gate trench 140t that intersects the first and second multi-channel active patterns 110 and 210.

The first gate spacer 140 may be located at both distal ends of each of the first and second multi-channel active patterns 110 and 210 extending in the first direction X1. The first gate spacers 140 may be formed to face each other on both sides of the first and second multi-channel active patterns 110 and 210. The first gate spacer 140 may include a penetration portion through which the respective first and second multi-channel active patterns 110 and 210 pass. Each of the first and second multi-channel active patterns 110 and 210 may pass through the first gate spacer 140. The first gate spacers 140 may entirely come into contact with the periphery of the distal ends of the respective first and second multi-channel active patterns 110 and 210.

The first gate spacer 140 may include a first inner spacer 141 and a first outer spacer 142. The first inner spacer 141 may be disposed between the first fin-type protrusion 100P and the first multi-channel active pattern 110, and between the first multi-channel active pattern 110 and the second multi-channel active pattern 210.

The first inner spacer 141 may be formed at a position vertically overlapping the first and second multi-channel active patterns 110 and 210. The first inner spacer 141 may not be formed on the field insulating layer 105 which does not overlap the first and second multi-channel active patterns 110 and 210. That is, the first outer spacer 142 may be formed on the upper surface of the field insulating layer 105. The first outer spacer 142 may be positioned on the second multi-channel active pattern 210.

The first inner spacer 141 may include, for example, at least one of silicon nitride (SiN), silicon oxynitride (SiON), silicon oxide ($SiO_2$), silicon oxycarbo nitride (SiOCN), and combinations thereof. The first outer spacer 142 may include, for example, at least one of silicon nitride (SiN), silicon oxynitride (SiON), silicon oxide (SiO$_2$), silicon oxycarbo nitride (SiOCN) and combinations thereof. In FIG. 2, the first inner spacer 141 and the first outer spacer 142 may be the same material or different materials.

The first gate insulating layer 135 may be formed along the respective first and second multi-channel active patterns 110 and 210. The first gate insulating layer 135 may be formed along the periphery of each of the first and second multi-channel active patterns 110 and 210. The first gate insulating layer 135 may surround each of the first and second multi-channel active patterns 110 and 210.

The first gate insulating layer 135 may include a first interfacial layer 136 and a first high dielectric constant insulating layer 137. The first interfacial layer 136 may be formed between the respective first and second multi-channel active patterns 110 and 210 and the first high dielectric constant insulating layer 137. The first interfacial layer 136 may be formed along the upper surface of the first fin-type protrusion 100P and the respective first and second multi-channel active patterns 110 and 210.

Although it is illustrated that the first interfacial layer 136 is not formed along the inner wall of the first gate spacer 140 and the upper surface of the field insulating layer 105, the present inventive concept is not limited thereto. Depending on the method of forming the interfacial layer, the first interfacial layer 136 may be formed along the side wall of the first gate spacer 140 and the upper surface of the field insulating layer 105.

The first high dielectric constant insulating layer 137 may be formed on the first interfacial layer 136. The first gate insulating layer 135 may also be formed on the upper surface of the field insulating layer 105 and on the first fin-type protrusion 100P. The first gate insulating layer 135 may extend along the inner wall of the gate spacer 140. The first gate insulating layer 135 may extend along the side wall and the bottom surface of the first gate trench 140t and the periphery of the first and second multi-channel active patterns 110 and 210. When the first and second multi-channel active patterns 110 and 210 include silicon, the first interfacial layer 136 may include silicon oxide (SiO$_2$). On the other hand, depending on the materials contained in the first and second multi-channel active patterns 110 and 210, the materials contained in the first interfacial layer 136 may of course vary.

It will be appreciated that, in some embodiments, a high dielectric constant, or high-κ, material may include a material having a dielectric constant that is greater than the dielectric constant of silicon dioxide. In some embodiments, the first high dielectric constant insulating layer 137 may include a high dielectric constant material having a dielectric constant greater than the dielectric constant of silicon nitride. The first high dielectric constant insulating layer 137 may include an insulating material containing a metal. The high dielectric constant material may include, for example, one or more among hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The first gate electrode structure 115 may be formed on the first gate insulating layer 135. The first gate electrode structure 115 may come into contact with the first high dielectric constant insulating layer 137. The first gate electrode structure 115 may intersect the first and second multi-channel active patterns 110 and 210. The first gate electrode structure 115 may surround the periphery of the first and second multi-channel active patterns 110 and 210. The first gate electrode structure 115 may be disposed between the first gate spacers 140. The first gate electrode structure 115 fills the first gate trench 140t and may extend in the second direction Y1.

A first work function adjusting liner 130 may be formed along the first high dielectric constant insulating layer 137. The first work function adjusting liner 130 may be formed along the circumference of the first and second multi-channel active patterns 110 and 210. The first work function adjusting liner 130 may be in contact with the first high dielectric constant insulating layer 137. Here, the term "contact" may mean that there is no layer to be inserted between the first work function adjusting liner 130 and the first high dielectric constant insulating layer 137.

The first work function adjusting liner 130 may include an insulating material. The first work function adjusting liner 130 may include an insulating material having a dielectric constant less than the dielectric constant of the first high dielectric constant insulating layer 137. The first work function adjusting liner 130 may include, for example, silicon nitride (SiN). In the semiconductor device according to some embodiments of the present inventive concept, the first work function adjusting liner 130 may be a silicon nitride layer.

For example, a thickness t12 of the first work function adjusting liner 130 is less than a thickness t11 of the first high dielectric constant insulating layer 137. The thickness t12 of the first work function adjusting liner 130 may be, for example, 5 Å or less.

Since the first work function adjusting liner 130 is formed to be in contact with the first high dielectric constant insulating layer 137, an effective work function of the semiconductor device may be adjusted. As a result, a threshold voltage of the semiconductor device may be controlled.

The first gate electrode 120 may be formed on the first work function adjusting liner 130. The first gate electrode 120 may be in contact with the first work function adjusting liner 130. The first gate electrode 120 may include a first conductive liner 121 and a first upper electrode 122.

The first conductive liner 121 may be formed on the first work function adjusting liner 130. The first conductive liner 121 may be in contact with the first work function adjusting liner 130. The first conductive liner 121 may be formed along the first work function adjusting liner 130. The first conductive liner 121 may be formed along the periphery of the first and second multi-channel active patterns 110 and 210. The first conductive liner 121 may be formed between an upper surface of the first fin-type protrusion 100P and a lower surface of the first multi-channel active pattern 110, and between an upper surface of the first multi-channel active pattern 110 and a lower surface of the second multi-channel active pattern 210. The first conductive liner 121 may be formed on the upper surface of the second multi-channel active pattern 210.

The first conductive liner 121 may include a conductive material. The first conductive liner 121 may include titanium (Ti) which is a metal. The first conductive liner 121 may include, for example, at least one of titanium nitride (TiN), titanium silicon nitride (TiSiN), titanium aluminum (TiAl), titanium aluminum carbide (TiAlC), titanium aluminum nitride (TiAlN), and titanium aluminum carbonitride (TiAlC—N).

As an example, the first conductive liner 121 may include a conductive nitride layer. The first conductive liner 121 may be a conductive layer made of, for example, one material selected from titanium nitride (TiN) and titanium silicon nitride (TiSiN). As another example, the first conductive liner 121 may include a conductive layer containing aluminum. The conductive layer containing aluminum may also include a conductive nitride layer. The first conductive liner 121 may be a conductive layer made of, for example, at least one material selected from the group consisting of titanium aluminum (TiAl), titanium aluminum carbide (TiAlC), titanium aluminum nitride (TiAlN) and titanium aluminum carbonitride (TiAlC—N).

The first upper electrode 122 may be formed on the first conductive liner 121. In FIGS. 2 and 3, the first upper electrode 122 is illustrated as not being formed between the upper surface of the first fin-type protrusion 100P and the lower surface of the first multi-channel active pattern 110, and between the upper surface of the first multi-channel active pattern 110 and the lower surface of the second multi-channel active pattern 210, but is not limited thereto.

The first upper electrode 122 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (Pb), tungsten carbide (WC), rhodium (Rh), palladium (Pd), iridium (Ir), osmium (Os), silver (Ag), gold (Au), zinc (Zn), vanadium (V), and combinations thereof.

The first semiconductor pattern 150 may be disposed on at least one side of the first gate electrode structure 115. The first semiconductor pattern 150 may be an epitaxial pattern formed through an epitaxial growth process. The first semiconductor pattern 150 may be connected to each of the first and second multi-channel active patterns 110 and 210. For example, the first semiconductor pattern 150 may be formed on the first fin-type protrusion 100P. The first semiconductor pattern 150 may be included in a source/drain of the transistor which uses the first and second multi-channel active patterns 110 and 210 as channel regions.

The interlayer insulating layer 190 may be formed on the first semiconductor pattern 150. The interlayer insulating layer 190 may surround the side wall of the first gate spacer 140. The interlayer insulating layer 190 may include a lower interlayer insulating layer 191 and an upper interlayer insulating layer 192. The upper interlayer insulating layer 192 may be formed on the upper surface of the first gate spacer 140 and the upper surface of the first gate electrode structure 115. The lower interlayer insulating layer 191 and the upper interlayer insulating layer 192 may each include, for example, at least one of silicon oxide, silicon nitride, and silicon oxynitride. Although not illustrated, an etching stop layer for protecting the first semiconductor pattern 150 at the time of contact may be further formed between the first semiconductor pattern 150 and the lower interlayer insulating layer 191. The etching stop layer may include material having an etching selection ratio to the lower interlayer insulating layer 191.

A transverse section of the first multi-channel active pattern 110 will be described with reference to FIGS. 4A to 4D. The explanation of the first multi-channel active pattern 110 may of course be applied to the second multi-channel active pattern 210.

Figure 4A:
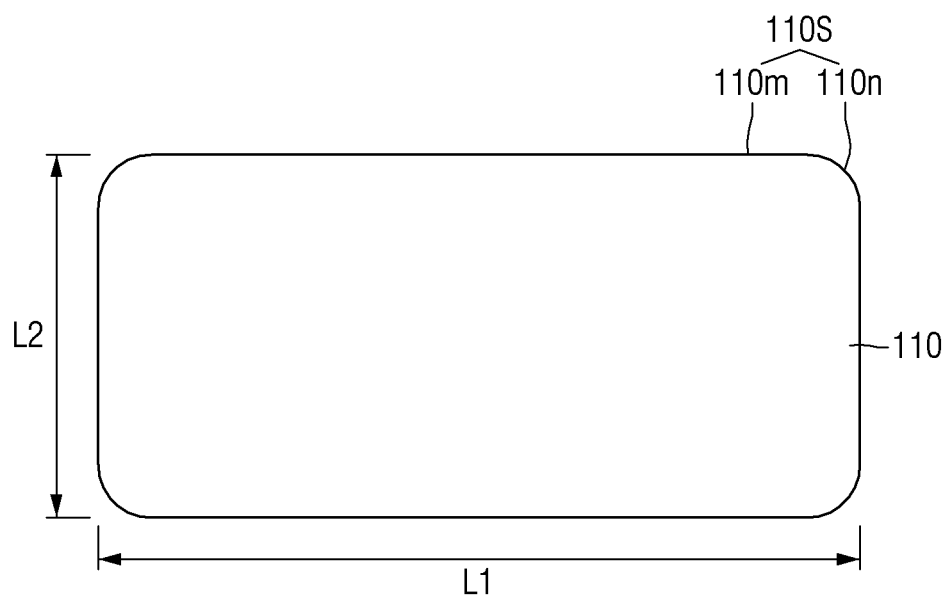
FIGS. 4A to 4D are various cross-sectional views of a first wire pattern of FIG. 1 taken along B-B.

In FIG. 4A, the transverse section 110S of the first multi-channel active pattern 110 may be a figure made up of a combination of a straight line 110m and a curved surface 100n. The transverse section 110S of the first multi-channel active pattern 110 may be, for example, a rectangle with a rounded corner. A width L1 of the first multi-channel active pattern 110 and the first multi-channel active pattern 110 may be different from each other in the transverse section 110S of the first multi-channel active pattern 110. For example, the transverse section 110S of the first multi-channel active pattern 110 may be a rectangle with a rounded corner, but it is not limited thereto.

Figure 4B:
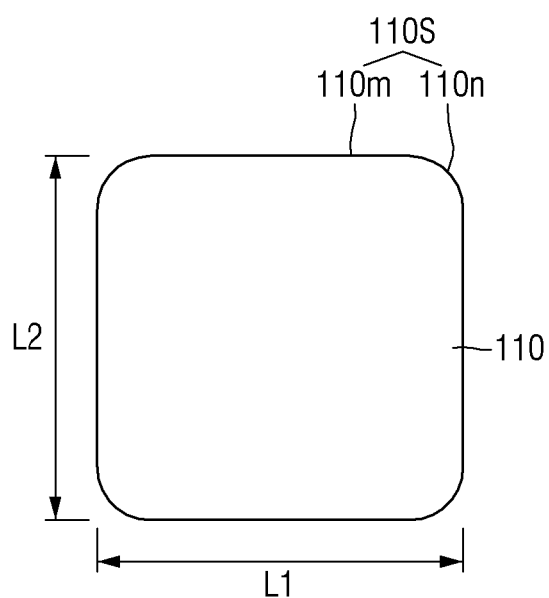

Unlike FIG. 4A, in FIG. 4B, the width L1 of the first multi-channel active pattern 110 and a height L2 of the first multi-channel active pattern 110 may be the same as each other in the transverse section 110S of the first multi-channel active pattern 110. For example, the transverse section 110S of the first multi-channel active pattern 110 may be a square with rounded corners, but is not limited thereto. Unlike in FIG. 4A, in FIG. 4C, a width L11 of one side of the first multi-channel active pattern 110 and a width L12 of the other side of the first multi-channel active pattern 110 facing each other may be different from each other in the transverse section 110S of the first multi-channel active pattern 110. For example, the transverse section 110S of the first multi-channel active pattern 110 may be a trapezoid with rounded corners, but is not limited thereto. Unlike FIG. 4A, in FIG. 4D, the transverse section 110S of the first multi-channel active pattern 110 may be a figure made up of a combination of the curved lines 110n.

Figure 4C:
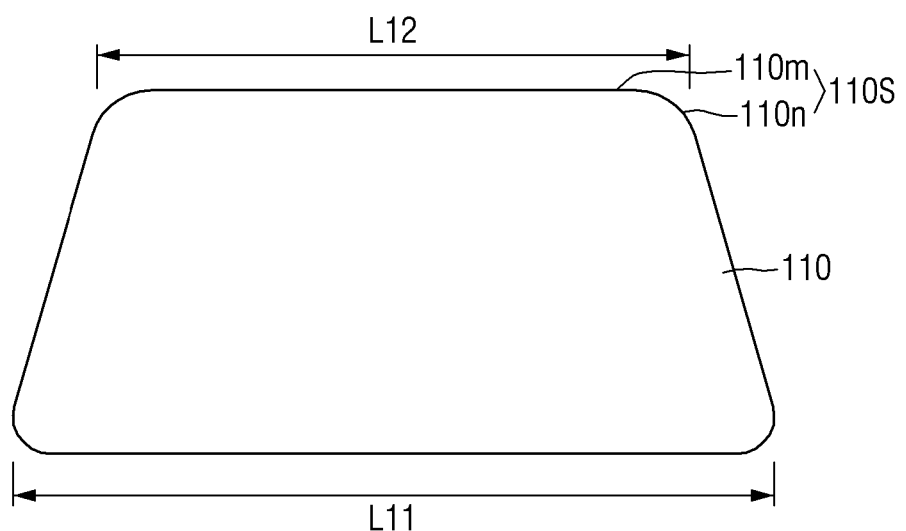
Figure 4D:
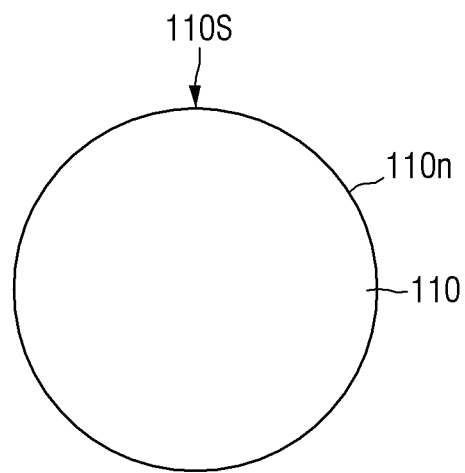

Unlike the configuration illustrated in FIGS. 4A to 4C, the transverse section 110S of the first multi-channel active pattern 110 may be one of the figures made up of a combination of the straight lines. The transverse section 110S of the first multi-channel active pattern 110 may also be a rectangle with no rounded corners.

A longitudinal section of the first multi-channel active pattern 110 will be described with reference to FIGS. 5A to 5C. The description of the first multi-channel active pattern 110 may of course be applied to the second multi-channel active pattern 210.

Figure 5A:
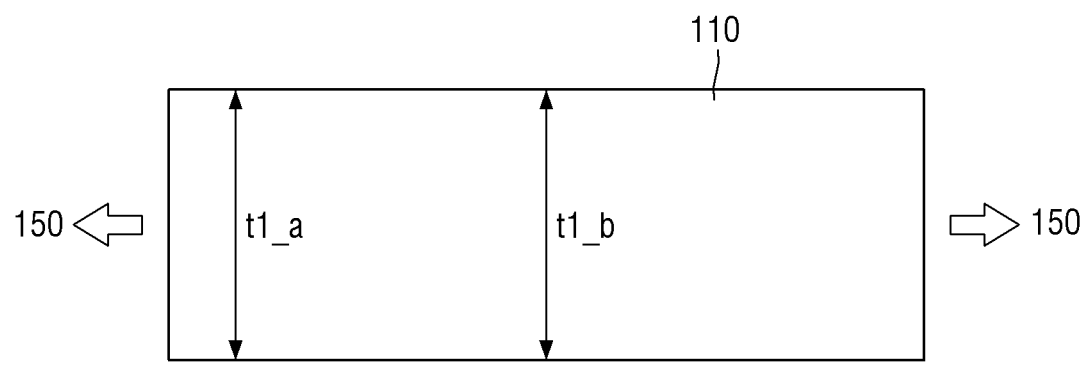
FIGS. 5A to 5C and FIG. 6 are various cross-sectional views of the first wire pattern of FIG. 1 taken along A-A.

In FIG. 5A, the thickness of the first multi-channel active pattern 110 may be substantially the same as it goes away from the first semiconductor pattern 150 and the first gate spacer 140. For example, a thickness t1_a of the longitudinal end portion of the first multi-channel active pattern 110 adjacent to the first semiconductor pattern 150 may be substantially the same as a thickness t1_b of a central portion of the first multi-channel active pattern 110.

Figure 5B:
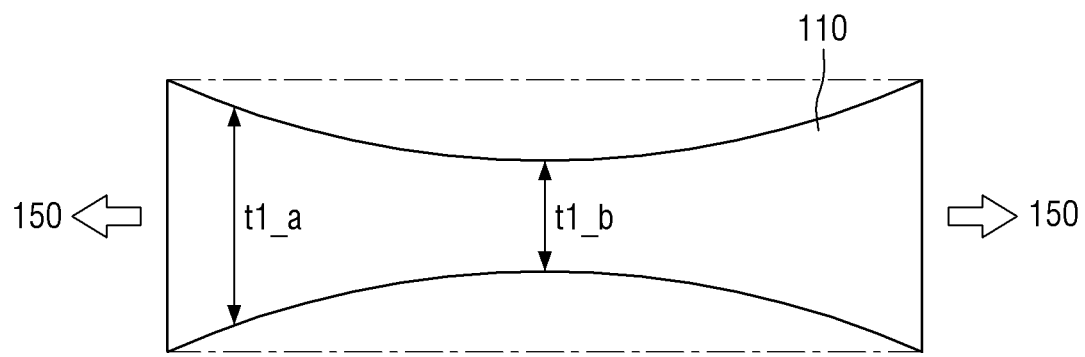
Figure 5C:
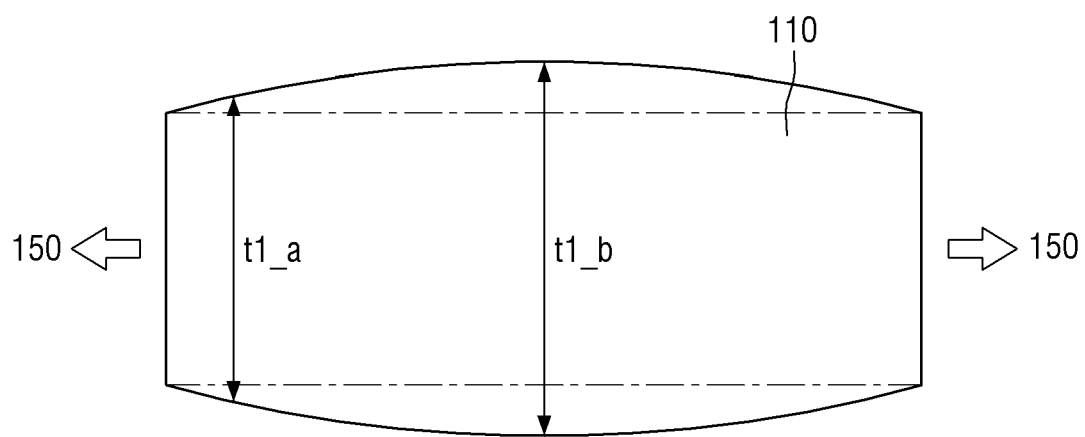

In FIG. 5B, the thickness of the first multi-channel active pattern 110 may be reduced as it goes away from the first semiconductor pattern 150 and the first gate spacer 140. For example, the thickness t1_a of the longitudinal end portion of the first multi-channel active pattern 110 adjacent to the first semiconductor pattern 150 may be thicker than the thickness t1_b of the central portion of the first multi-channel active pattern 110. In FIG. 5C, the thickness of the first multi-channel active pattern 110 may increase as it goes away from the first semiconductor pattern 150 and the first gate spacer 140. For example, the thickness t1_a of the longitudinal end portion of the first multi-channel active pattern 110 adjacent to the first semiconductor pattern 150 may be thinner than the thickness t1_b of the central portion of the first multi-channel active pattern 110. In FIGS. 5B and 5C, the thickness of the first multi-channel active pattern 110 may be changed continuously as it goes away from the first semiconductor pattern 150 and the first gate spacer 140.

A longitudinal section of the first multi-channel active pattern 110 will be described with reference to FIG. 6. The description of the first multi-channel active pattern 110 may of course be applied to the second multi-channel active pattern 210.

The first multi-channel active pattern 110 may be a trimmed wire pattern. The first multi-channel active pattern 110 may include a first section 110a and a second section 110b. The second section 110b of the first multi-channel active pattern may be disposed on both sides of the first section 110a of the first multi-channel active pattern. The second section 110b of the first multi-channel active pattern may be a section which overlaps the first gate spacer 140, and the first section 110a of the first multi-channel active pattern 110 may be section which overlaps the first gate insulating layer 135 and the first gate electrode structure 115.

The thickness $t1\_c$ of the second section 110b of the first multi-channel active pattern is greater than the thickness $t1\_d$ of the first section 110a of the first multi-channel active pattern.

Figure 6:
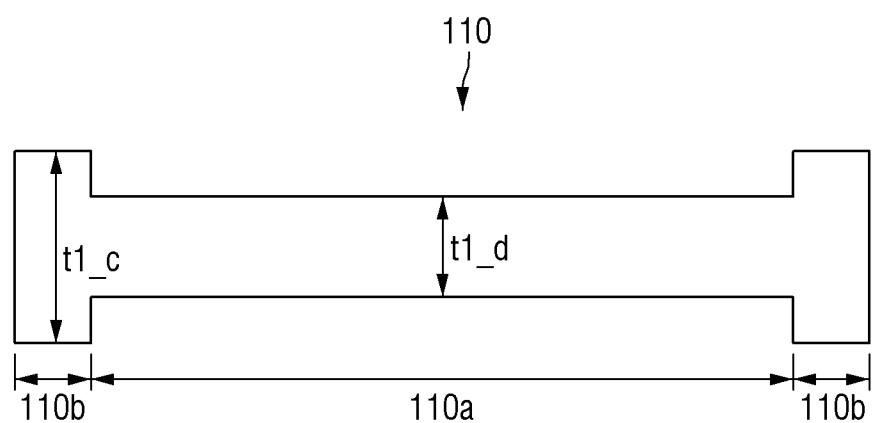

Unlike the configuration illustrated in FIG. 6, a connection portion between the second section 110b of the first multi-channel active pattern and the first section 110a of the first multi-channel active pattern may, of course, be rounded. Further, in FIG. 6, although the width of the first section 110a of the first multi-channel active pattern is illustrated to be constant irrespective of location, it is only for convenience of description, and the inventive concept is not limited to thereto. That is, the width of the first section 110a of the first multi-channel active pattern may, of course, change, as illustrated in FIG. 5B or 5C.

Figure 7:
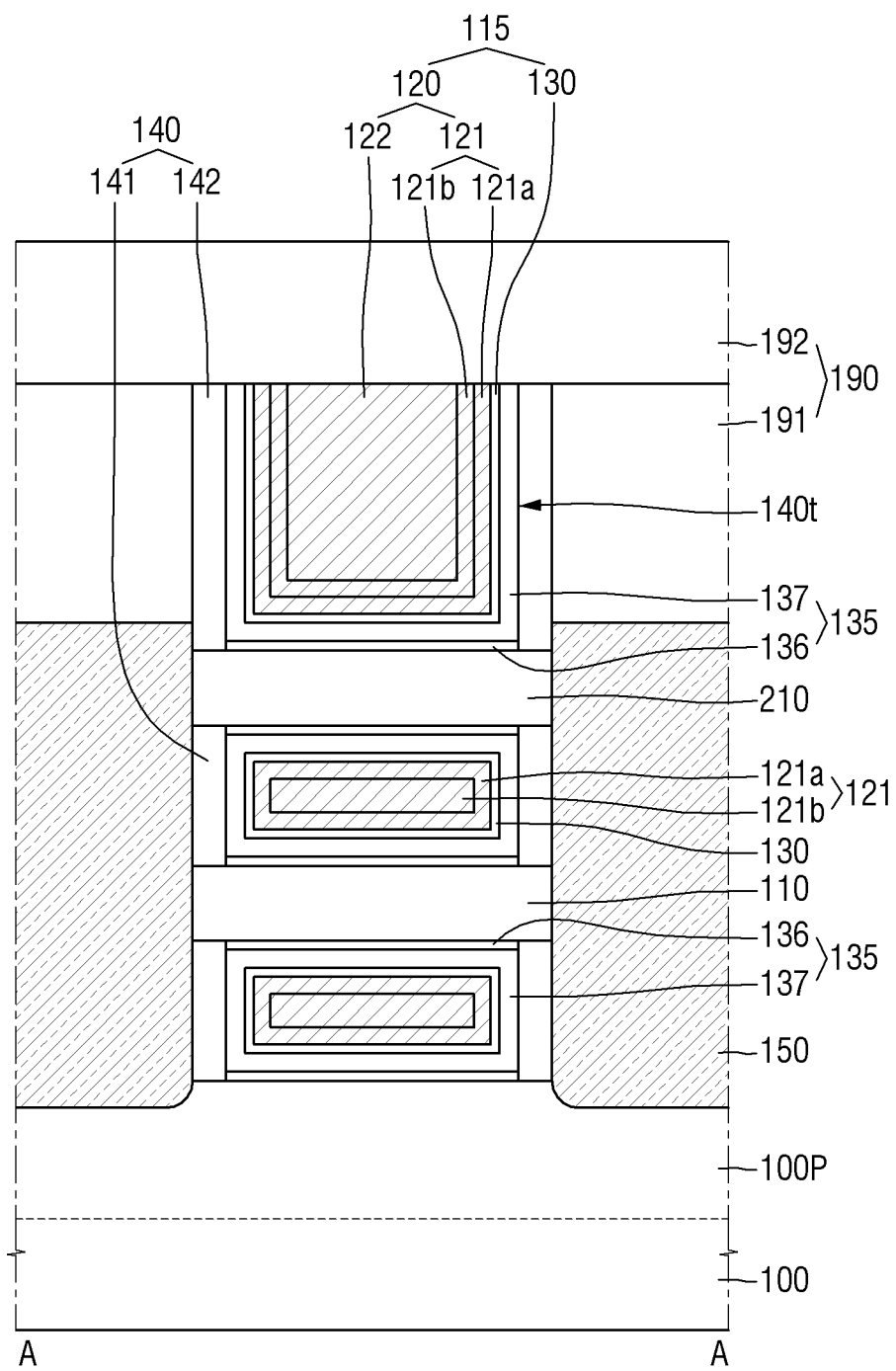
FIGS. 7 and 8 are diagrams for explaining a semiconductor device according to some embodiments of the present inventive concept.
Figure 8:
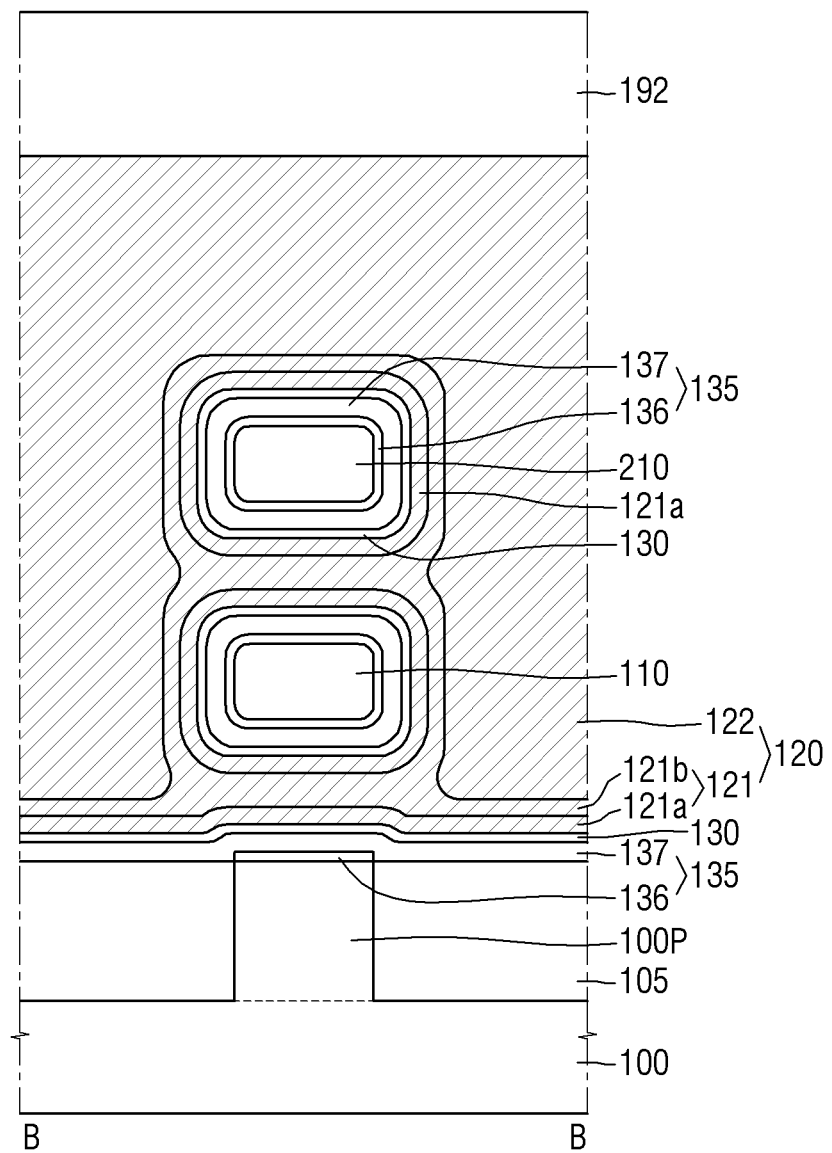
Figure 9:
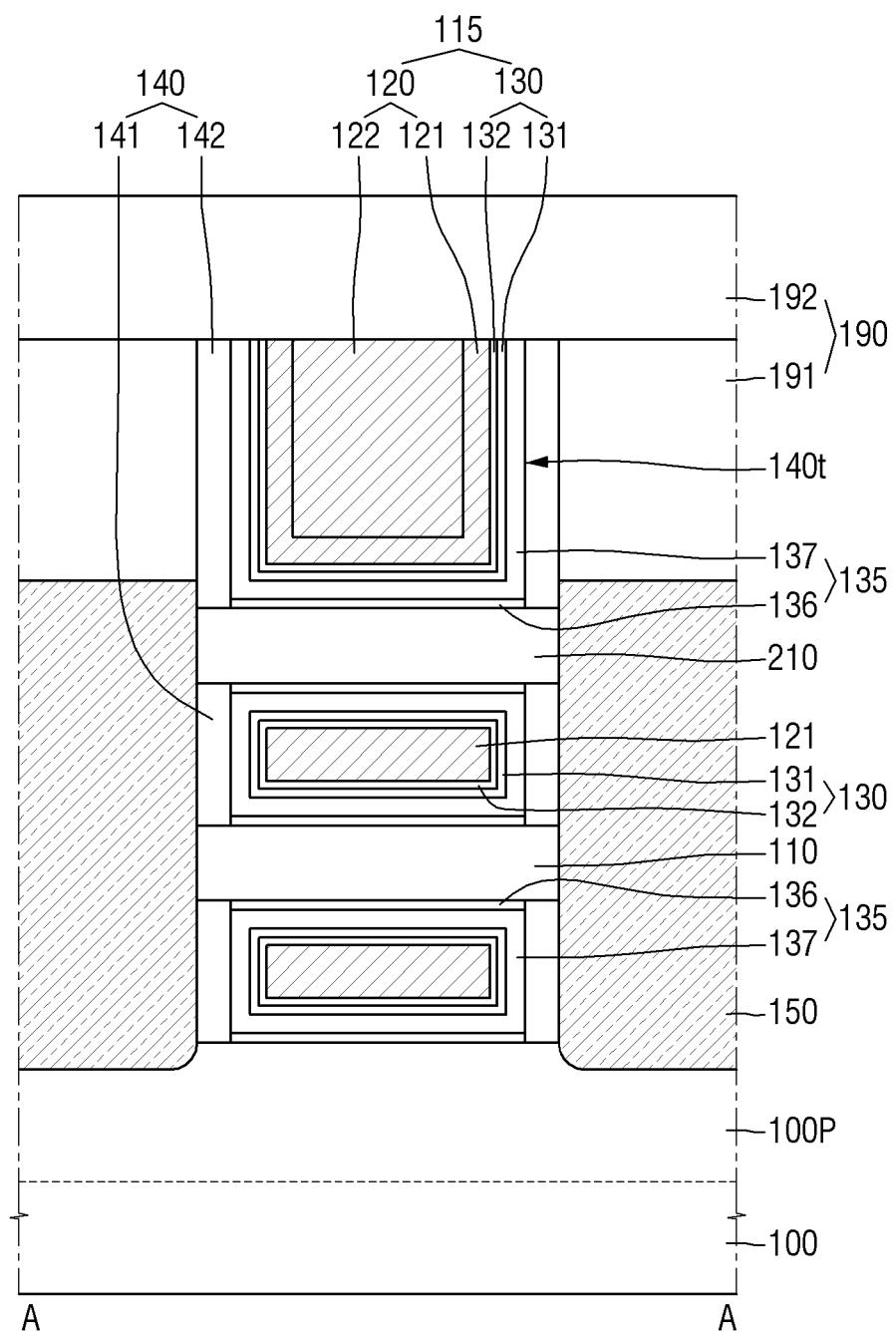
FIGS. 9 and 10 are diagrams for explaining the semiconductor device according to some embodiments of the present inventive concept.
Figure 10:
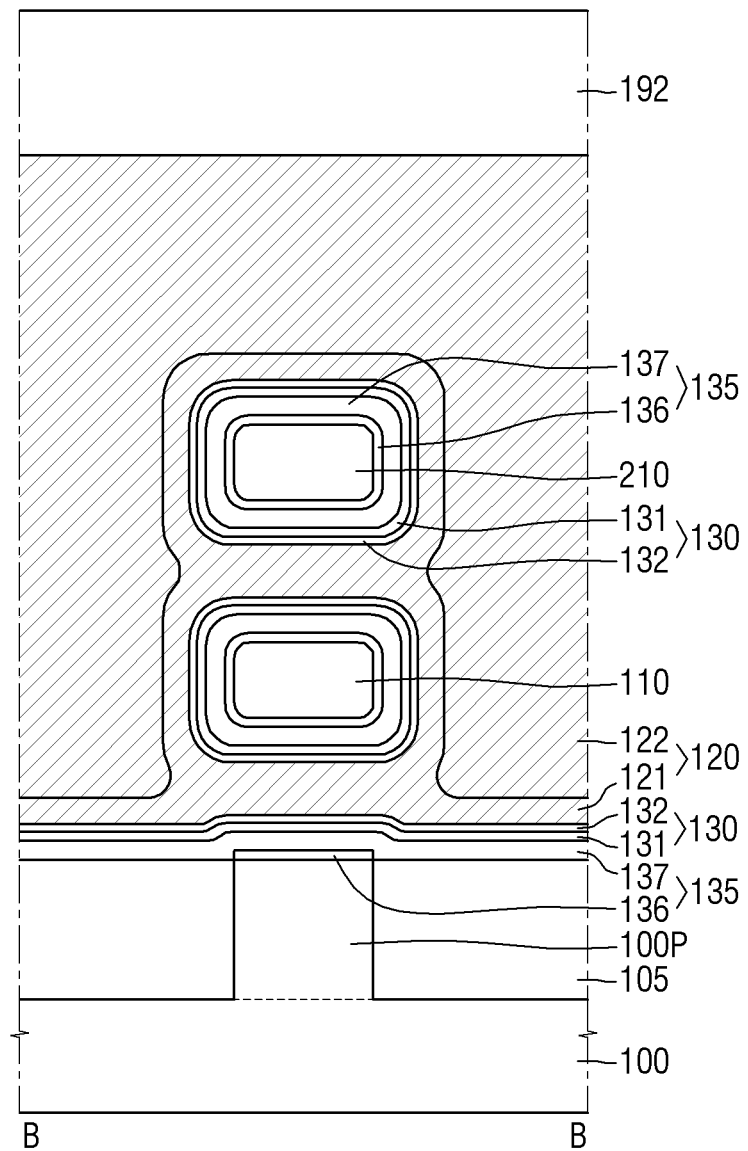
Figure 11:
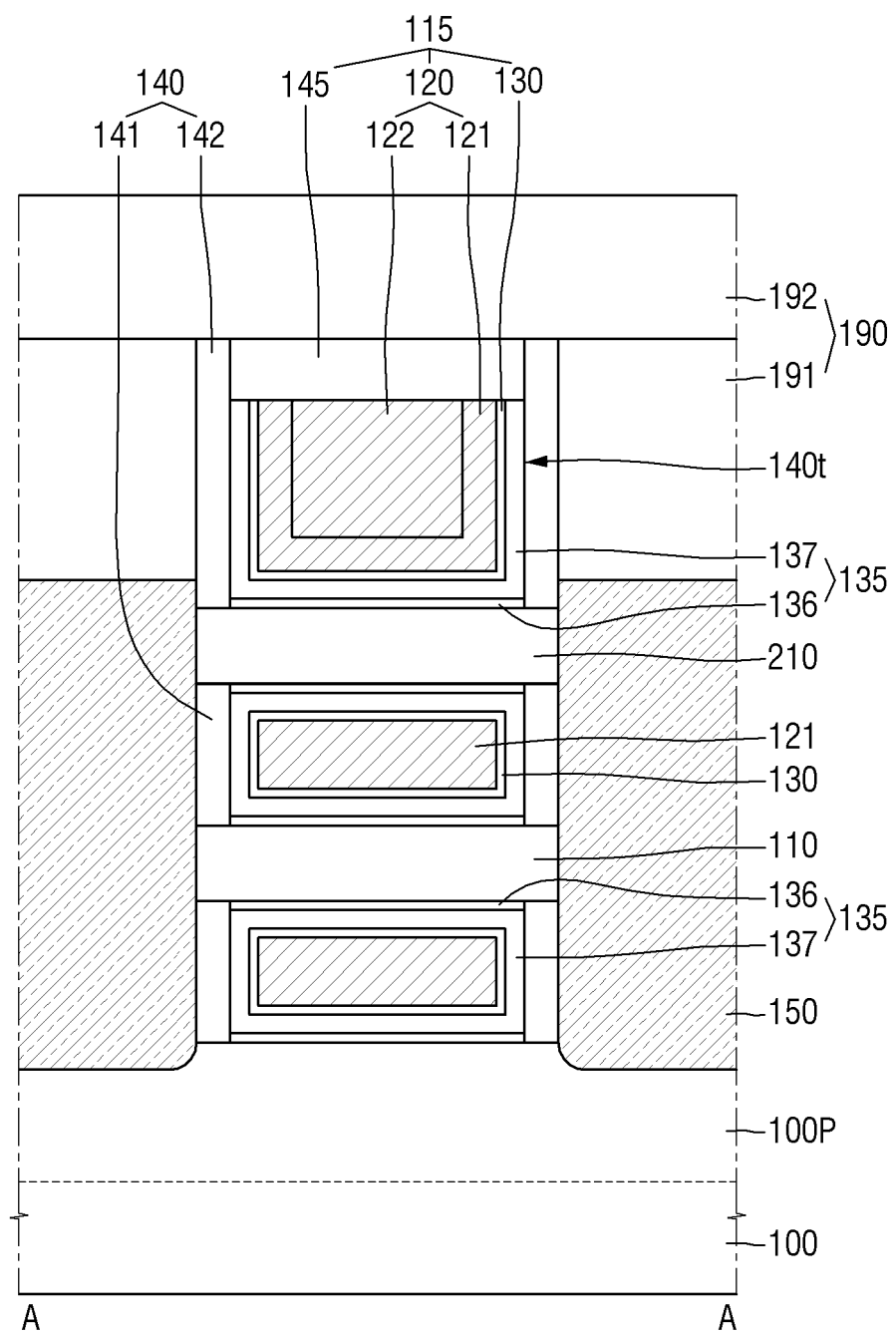
FIGS. 11 to 13 are diagrams for explaining the semiconductor device according to some embodiments of the present inventive concept, respectively.
Figure 12:
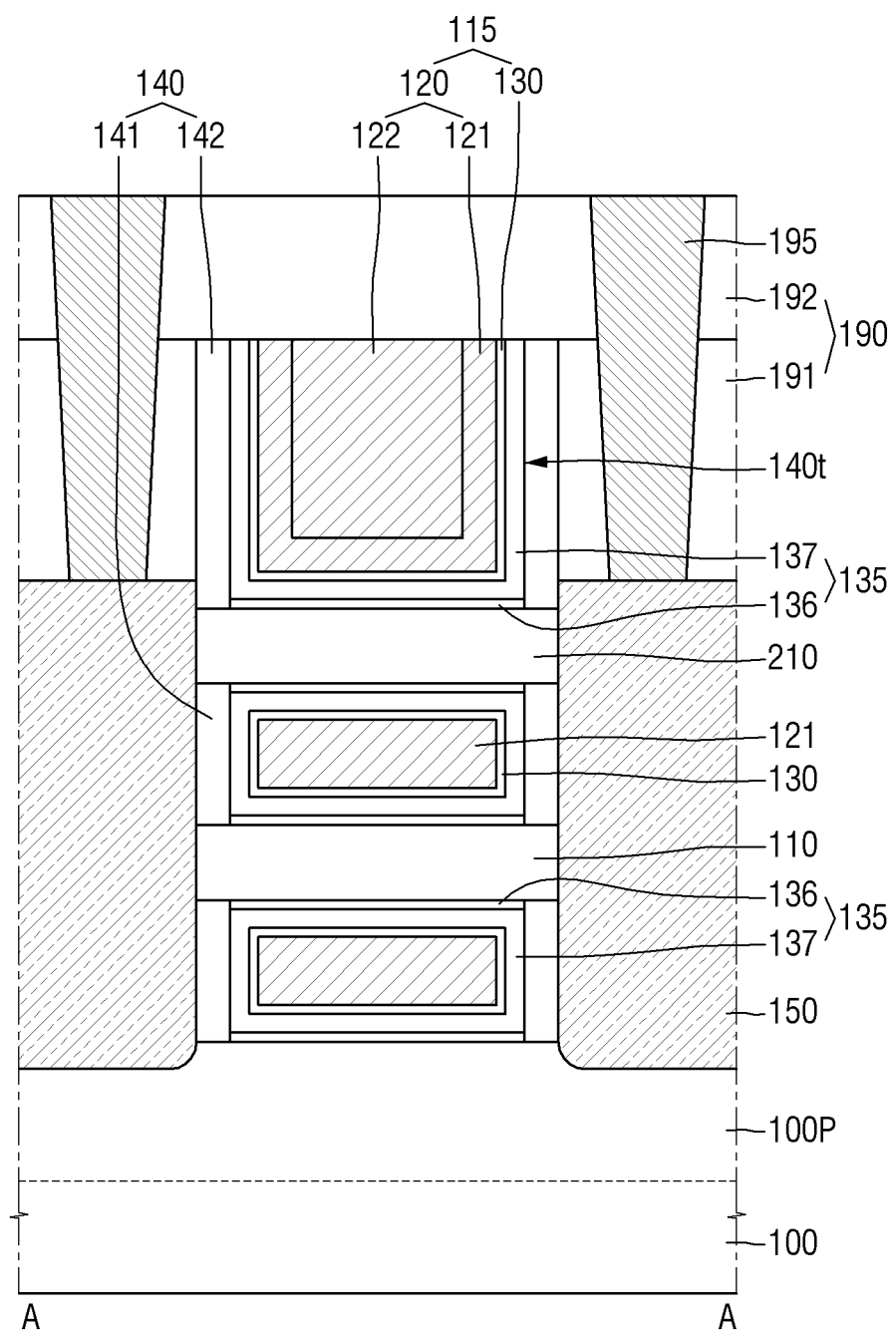
Figure 13:
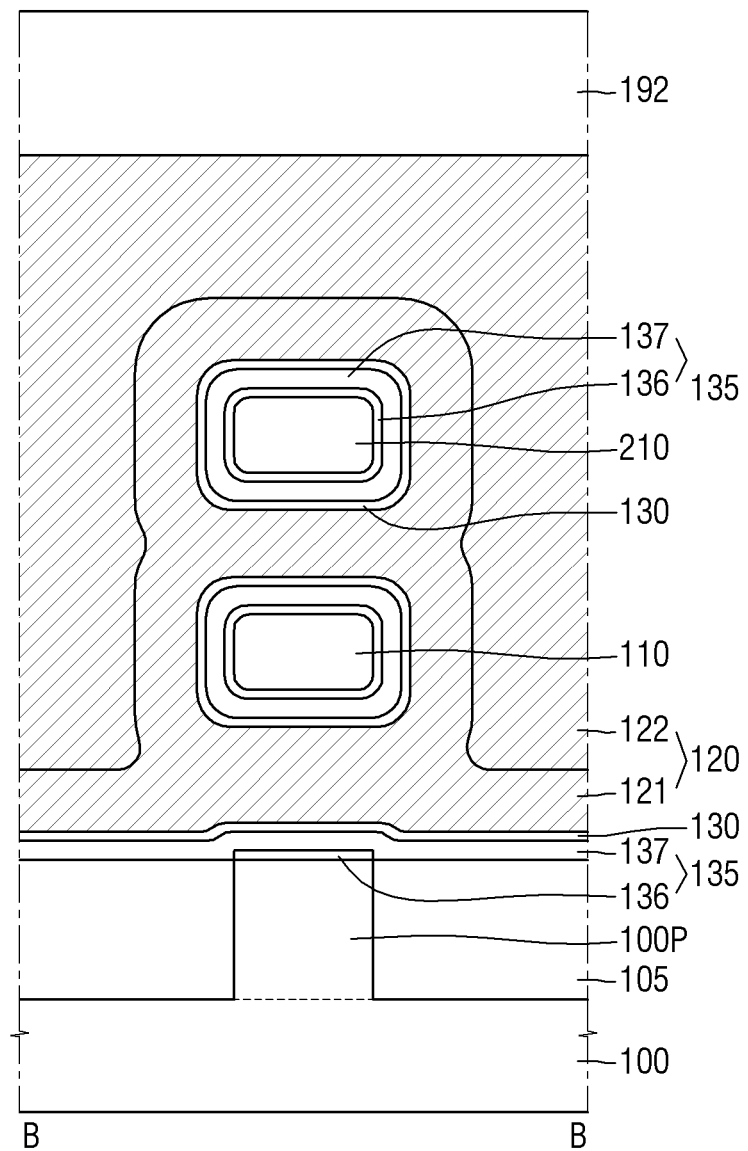
Figure 14:
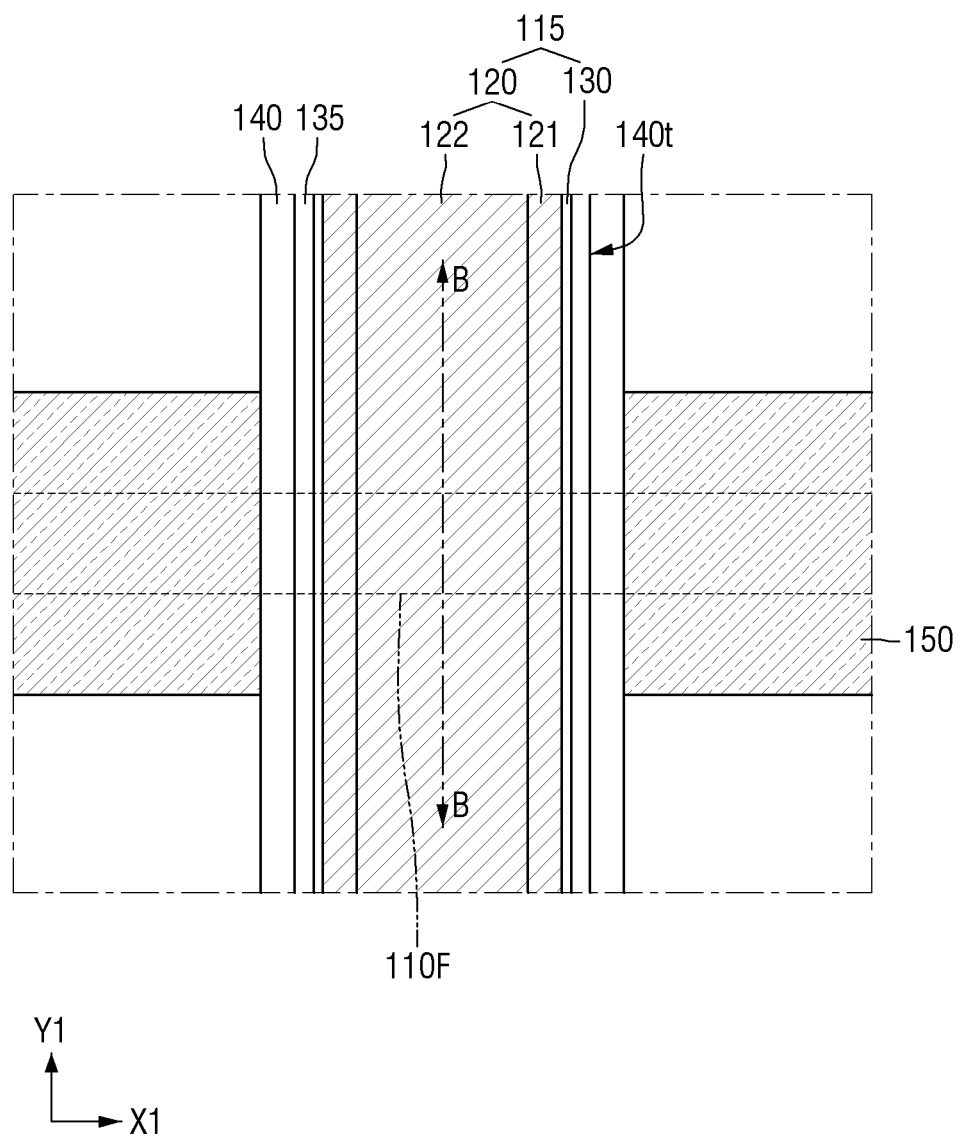
FIGS. 14 and 15 are diagrams for explaining the semiconductor device according to some embodiments of the present inventive concept.
Figure 15:
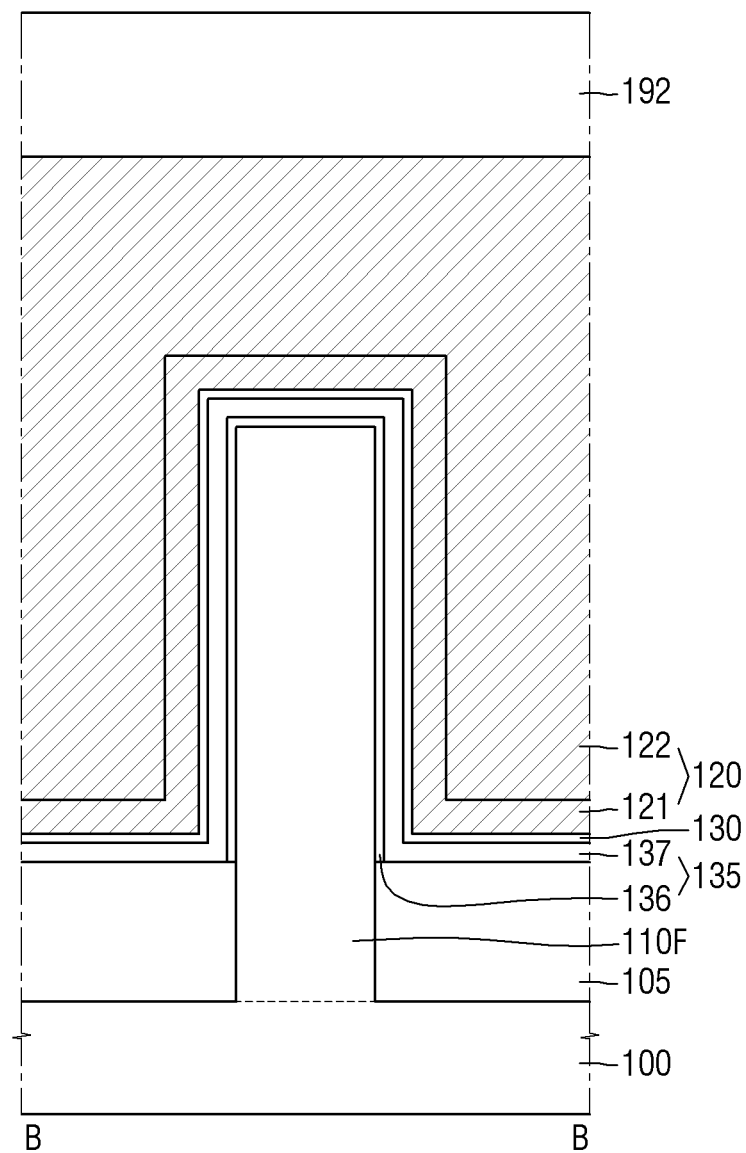

FIGS. 7 and 8 are diagrams for explaining the semiconductor device according to some embodiments of the present inventive concept. FIGS. 9 and 10 are diagrams for explaining the semiconductor device according to some embodiments of the present inventive concept. FIGS. 11 to 13 are diagrams for explaining the semiconductor device according to some embodiments of the present inventive concept, respectively. FIGS. 14 and 15 are diagrams for explaining the semiconductor device according to some embodiments of the present inventive concept. For the sake of convenience of explanation, differences from those described using FIGS. 1 to 3 will be mainly described.

Referring to FIGS. 7 and 8, in the semiconductor device according to some embodiments of the present inventive concept, the first conductive liner 121 may include a first lower conductive liner 121a, and a first upper conductive liner 121b.

The first lower conductive liner 121a may be in contact with the first work function adjusting liner 130. The first upper conductive liner 121b may be formed on the first lower conductive liner 121a.

As an example, the first lower conductive liner 121a and the first upper conductive liner 121b may each include a conductive nitride layer. The first lower conductive liner 121a may include a titanium nitride layer, and the first upper conductive liner 121b may include a titanium silicon nitride layer. Alternatively, the first lower conductive liner 121a may include a titanium silicon nitride layer, and the first upper conductive liner 121b may include a titanium nitride layer.

As another example, the first lower conductive liner 121a may include a conductive nitride layer, and the first upper conductive liner 121b may include a conductive layer containing aluminum. The first lower conductive liner 121a may include a titanium nitride layer. The first upper conductive liner 121b may include a conductive layer including at least one material selected from a group consisting of titanium aluminum (TiAl), titanium aluminum carbide (TiAlC), titanium aluminum nitride (TiAlN) and titanium aluminum carbonitride (TiAlC—N).

Referring to FIGS. 9 and 10, in the semiconductor device according to some embodiments of the present inventive concept, the first work function adjusting liner 130 may include a first lower adjusting liner 131 and a first upper adjusting liner 132.

The first lower adjusting liner 131 may be in contact with the first high dielectric constant insulating layer 137. The first upper adjusting liner 132 may be formed on the first lower adjusting liner 131.

The first lower adjusting liner 131 may include an insulating material. The first lower adjusting liner 131 may include an insulating material having a dielectric constant less than the dielectric constant of the first high dielectric constant insulating layer 137. The first lower adjusting liner 131 may include, for example, silicon nitride (SiN). In the semiconductor device according to some embodiments of the present inventive concept, the first lower adjusting liner 131 may be a silicon nitride layer.

As an example, the first upper adjusting liner 132 may include a layer obtained by oxidation of the material included in the first lower adjusting liner 131. For example, the first upper adjusting liner 132 may include a silicon oxynitride layer obtained by oxidation of silicon nitride.

As another example, the first upper adjusting liner 132 may include a layer obtained by oxidation of the material included in the first conductive liner 121. As an example, in a case where the first conductive liner 121 includes titanium nitride, the first upper adjusting liner 132 may include one of titanium oxide or titanium oxynitride.

Referring to FIG. 11, in the semiconductor device according to some embodiments of the present inventive concept, the first gate electrode structure 115 may further include a capping pattern 145.

The first gate electrode 120 may fill a part of the first gate trench 140t. The capping pattern 145 may be formed on the first gate electrode 120. The capping pattern 145 may fill the rest of the first gate trench 140t which is left after formation of the first gate electrode 120.

In FIG. 11, it is illustrated that the first high dielectric constant insulating layer 137 and the first work function adjusting liner 130 are not formed between the first gate spacer 140 and the capping pattern 145. However, it is only for convenience of explanation, and the inventive concept is not limited thereto. In FIG. 11, the capping pattern 145 is illustrated as being formed between the inner walls of the first gate spacer 140, but the present inventive concept is not limited thereto. The upper surface of the first gate spacer 140 may also be recessed below the upper surface of the lower interlayer insulating layer 191, like the first gate electrode 120. In such a case, the capping pattern 145 may be formed on the upper surface of the first gate spacer 140 and the upper surface of the first gate electrode 120.

The upper surface of the capping pattern 145 may be placed on the same plane as the upper surface of the lower interlayer insulating layer 191. The capping pattern 145 may include, for example, a material having an etching selection ratio to the lower interlayer insulating layer 191. The capping pattern 145 may include, for example, at least one of silicon nitride (SiN), silicon oxynitride (SiON), silicon oxide (SiO$_2$), silicon carbonitride (SiCN), silicon oxycarbonitride (SiOCN) and combinations thereof.

Referring to FIG. 12, the semiconductor device according to some embodiments of the present inventive concept may further include a contact 195 connected to the first semiconductor pattern 150.

The contact 195 may be formed on the first semiconductor pattern 150 through the interlayer insulating layer 190. Although it is illustrated that the contact 195 does not enter the first semiconductor pattern 150, the inventive concept is not limited thereto. The contact 195 may include, for example, at least one of tantalum (Ta), tantalum nitride (TaN), titanium (Ti), titanium nitride (TiN), tungsten nitride (WN), tungsten carbonitride (WCN), tungsten (W), cobalt (Co), ruthenium (Ru), molybdenum (Mo), nickel (Ni), aluminum (Al), copper (Cu), and doped polysilicon. Unlike the illustrated configuration, a silicide layer may be formed between the contact 195 and the first semiconductor pattern 150.

Referring to FIG. 13, in the semiconductor device according to some embodiments of the present inventive concept, a distance between the first fin-type protrusion 100P and the first multi-channel active pattern 110 spaced apart in the height direction may be different from a distance between the first multi-channel active pattern 110 and the second multi-channel active pattern 210 spaced apart in the height direction.

The distance between the first fin-type protrusion 100P and the first multi-channel active pattern 110 spaced apart in the height direction may be greater than the distance between the first multi-channel active pattern 110 and the second multi-channel active pattern 210 spaced apart in the height direction, but is not limited to thereto.

Referring to FIGS. 14 and 15, in the semiconductor device according to some embodiments of the present inventive concept, the multi-channel active pattern may be a first fin-type pattern 110F.

A part of the first fin-type pattern 110F may protrude above the upper surface of the field insulating layer 105. The first fin-type pattern 110F may include silicon or germanium which is an element semiconductor material. Further, the first fin-type pattern 110F may include, for example, a group IV-IV compound semiconductor or an III-V group compound semiconductor.

The first interfacial layer 136 may be formed along the profile of the first fin-type pattern 110F protruding above the upper surface of the field insulating layer 105. The first high dielectric constant insulating layer 137, the first work function adjusting liner 130, and the first conductive liner 121 may be formed along the profile of the first fin-type pattern 110F and the upper surface of the field insulating layer 105.

Figure 16:
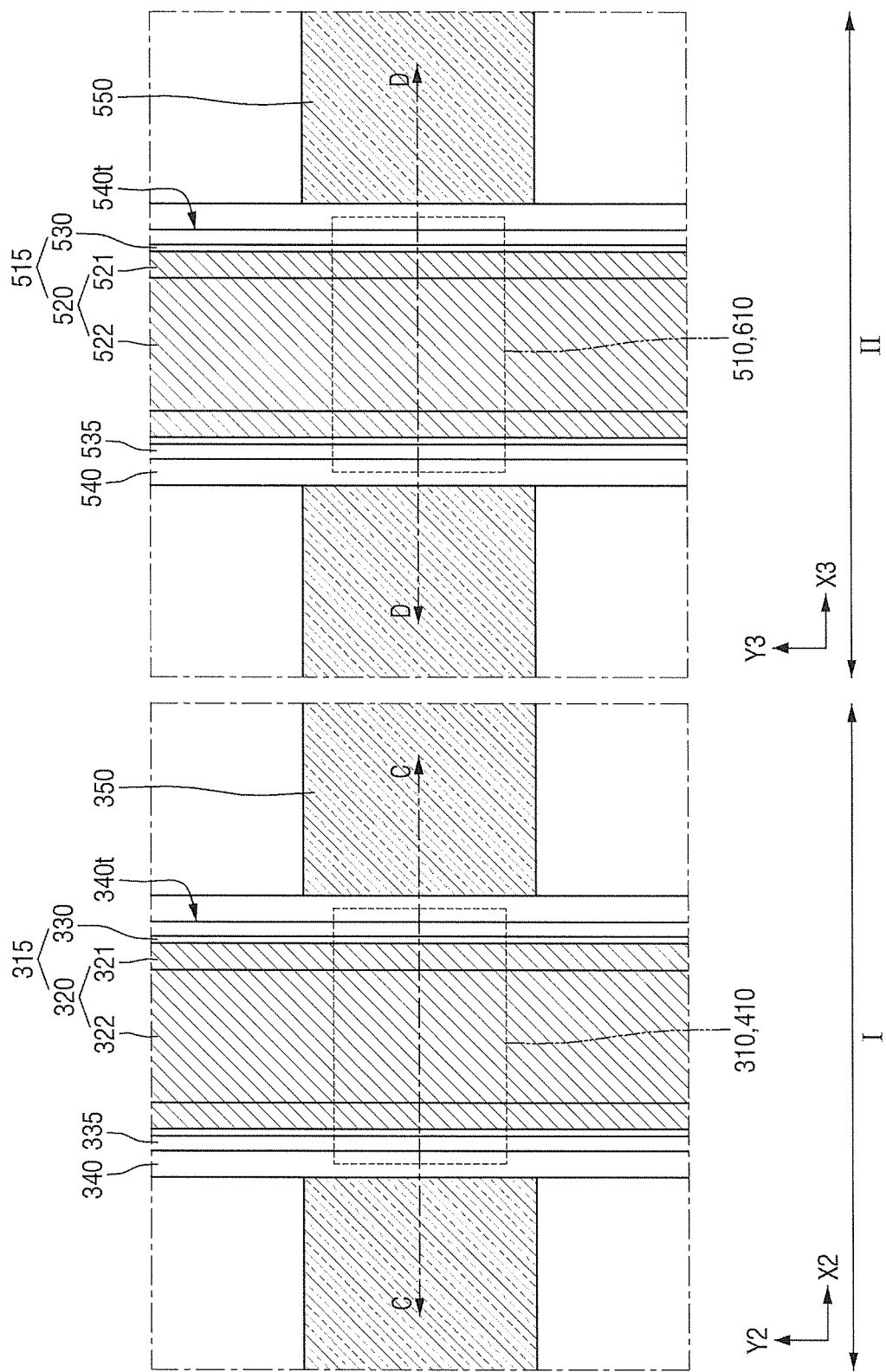
FIGS. 16 to 18 are diagrams for explaining the semiconductor device according to some embodiments of the present inventive concept.
Figure 17:
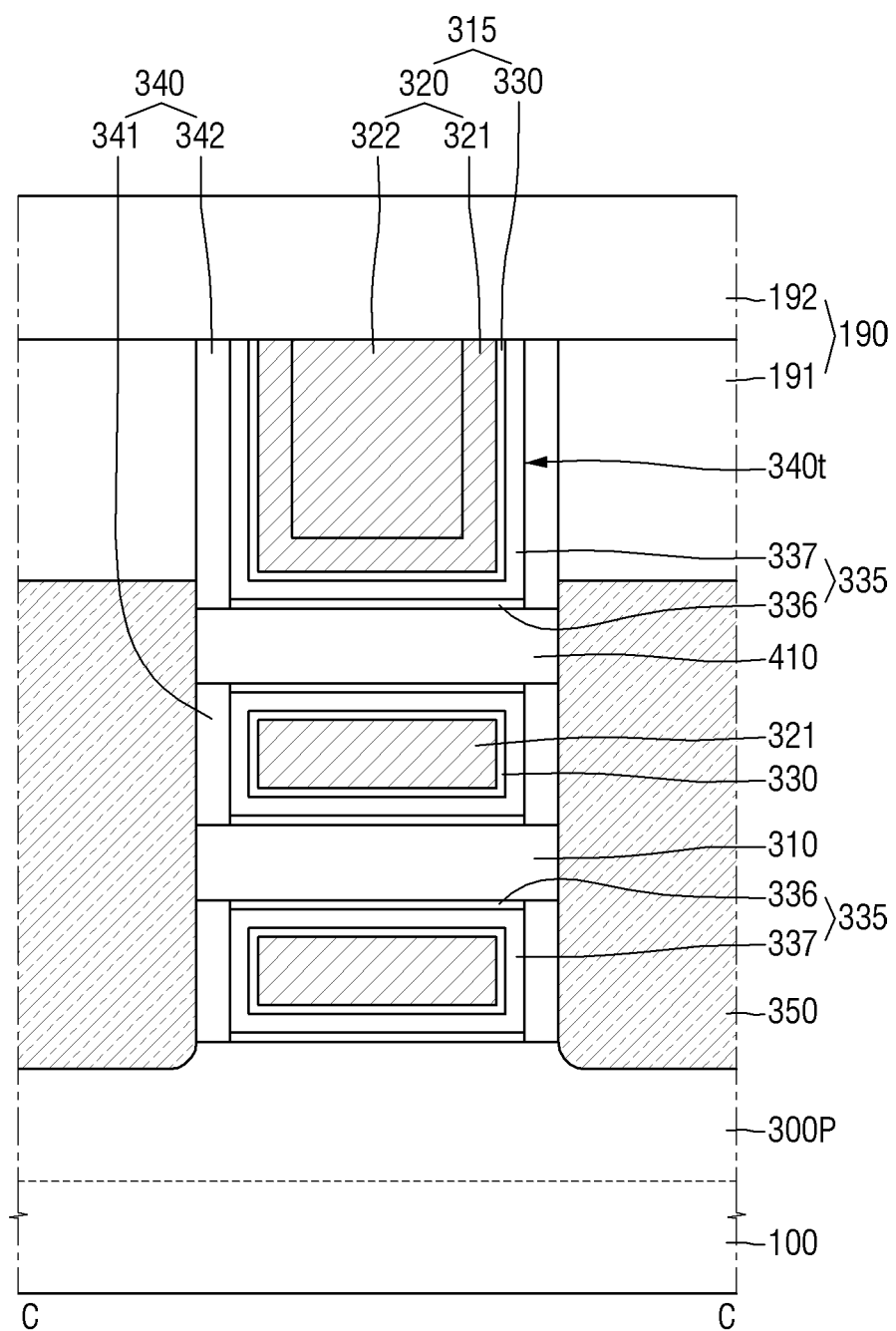
Figure 18:
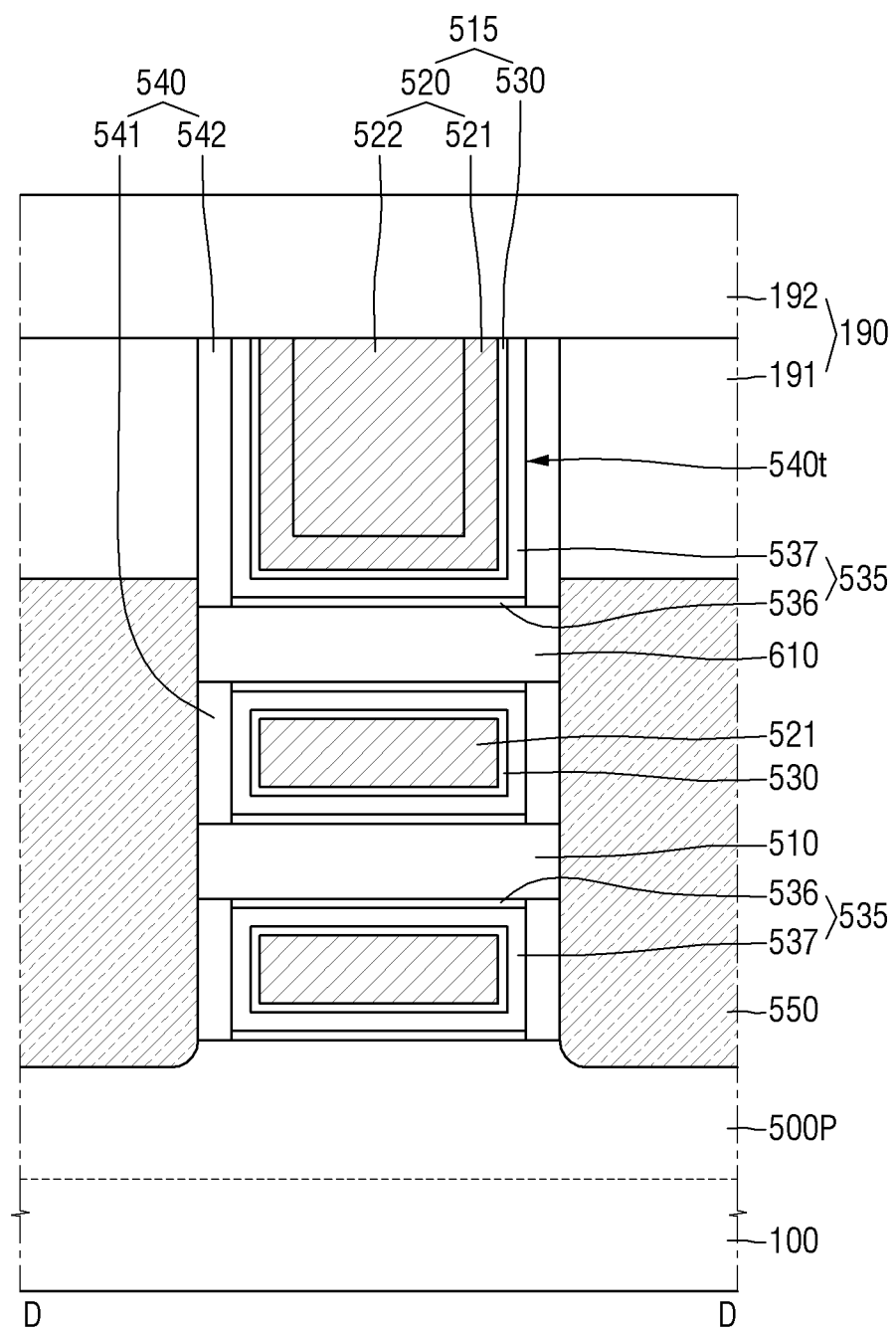

FIGS. 16 to 18 are diagrams for explaining the semiconductor device according to some embodiments of the present inventive concept. FIG. 16 is a plan view for explaining the semiconductor device according to some embodiments of the present inventive concept, and FIGS. 17 and 18 are cross-sectional views taken along line C-C and DD of FIG. 16. For reference, the contents that may overlap those described with reference to FIGS. 1 to 3 will be briefly explained or omitted.

Referring to FIGS. 16 to 18, the semiconductor device according to some embodiments of the present inventive concept may include third to sixth multi-channel active patterns 310, 410, 510 and 610, a second gate electrode structure 315, a third gate electrode structure 515, a second gate insulating layer 335, and a third gate insulating layer 535. The second gate electrode structure 315 may include a second work function adjusting liner 330 and a second gate electrode 320, and the third gate electrode structure 515 may include a third work function adjusting liner 530 and a third gate electrode 520.

The substrate 100 may include a first region I and a second region II. The first region I and the second region II may be regions spaced apart from each other, and may be regions connected to each other.

The second fin-type protrusion 300P, the third and fourth multi-channel active regions 310 and 410, the second gate electrode structure 315, and the second gate insulating layer 335 may be formed in the first region I of the substrate 100. The third fin-type protrusion 500P, the fifth and sixth multi-channel active regions 510 and 610, the third gate electrode structure 515, and the third gate insulating layer 535 may be formed in the second region II of the substrate 100. The second fin-type protrusion 300P and the third fin-type protrusion 500P may protrude from the substrate 100. The second fin-type protrusion 300P may extend long in a third direction X2. The third fin-type protrusion 500P may extend long in a fifth direction X3. The field insulating layer 105 may surround at least a part of the side wall of the second fin-type protrusion 300P and the side wall of the third fin-type protrusion 500P.

The third and fourth multi-channel active patterns 310 and 410 may be sequentially formed on the substrate 100. The third and fourth multi-channel active patterns 310 and 410 may be sequentially disposed on the second fin-type protrusion 300P. The third and fourth multi-channel active patterns 310 and 410 may extend in the third direction X2. The fifth and sixth multi-channel active patterns 510 and 610 may be sequentially formed on the substrate 100. The fifth and sixth multi-channel active patterns 510 and 610 may be sequentially disposed on the third fin-type protrusion 500P. The fifth and sixth multi-channel active patterns 510 and 610 may extend in the fifth direction X3. For example, the third to sixth multi-channel active patterns 310, 410, 510 and 610 may be third to sixth nanowires, respectively.

The second gate spacer 340 may extend in the fourth direction Y2. The second gate spacer 340 may intersect the third and fourth multi-channel active patterns 310 and 410. The second gate spacer 340 may define a second gate trench 340t that intersects the third and fourth multi-channel active patterns 310 and 410. The second gate spacer 340 may include a second inner spacer 341 and a second outer spacer 342. The third gate spacer 540 may extend in a sixth direction Y3. The third gate spacer 540 may intersect the fifth and sixth multi-channel active patterns 510 and 610. The third gate spacer 540 may define a third gate trench 540t that intersects the fifth and sixth multi-channel active patterns 510 and 610. The third gate spacer 540 may include a third inner spacer 541 and a third outer spacer 542.

The second gate insulating layer 335 may be formed along the third and fourth multi-channel active patterns 310 and 410, respectively. The second gate insulating layer 335 may be formed along the periphery of each of the third and fourth multi-channel active patterns 310 and 410. The third gate insulating layer 535 may be formed along each of the fifth and sixth multi-channel active patterns 510 and 610. The third gate insulating layer 535 may be formed along the periphery of each of the fifth and sixth multi-channel active patterns 510 and 610.

The second gate insulating layer 335 may include a second interfacial layer 336 and a second high dielectric constant insulating layer 337. The third gate insulating layer 535 may include a third interfacial layer 536 and a third high dielectric constant insulating layer 537. Each of the second and third high dielectric constant insulating layers 337 and 537 may include a high dielectric constant material having a dielectric constant greater than that of silicon nitride. The second and third high dielectric constant insulating layers 337 and 537 may include insulating materials each including metal.

The second gate electrode structure 315 may be formed on the second gate insulating layer 335. The second gate electrode structure 315 may be in contact with the second high dielectric constant insulating layer 337. The second gate electrode structure 315 fills the second gate trench 340*t* and may extend in the fourth direction Y2. The third gate electrode structure 515 may be formed on the third gate insulating layer 535. The third gate electrode structure 515 may be in contact with the third high dielectric constant insulating layer 537. The third gate electrode structure 515 fills the third gate trench 540*t* and may extend in the sixth direction Y3.

The second work function adjusting liner 330 may be formed along the second high dielectric constant insulating layer 337. The second work function adjusting liner 330 may be formed along the periphery of the third and fourth multi-channel active patterns 310 and 410. The second work function adjusting liner 330 may be in contact with the second high dielectric constant insulating layer 337. The thickness of the second work function adjusting liner 330 is less than the thickness of the second high dielectric constant insulating layer 337.

The second gate electrode 320 may be formed on the second work function adjusting liner 330. The second gate electrode 320 may be in contact with the second work function adjusting liner 330. The second gate electrode 320 may include a second conductive liner 321 and a second upper electrode 322. The second conductive liner 321 may be formed on the second work function adjusting liner 330. The second conductive liner 321 may be in contact with the second work function adjusting liner 330. The second conductive liner 321 may be formed along the second work function adjusting liner 330. The second conductive liner 321 may be formed along the periphery of the third and fourth multi-channel active patterns 310 and 410.

The third work function adjusting liner 530 may be formed along the third high dielectric constant insulating layer 537. The third work function adjusting liner 530 may be formed along the periphery of the fifth and sixth multi-channel active patterns 510 and 610. The third work function adjusting liner 530 may be in contact with the third high dielectric constant insulating layer 537. The thickness of the third work function adjusting liner 530 is less than the thickness of the third high dielectric constant insulating layer 537.

The third gate electrode 520 may be formed on the third work function adjusting liner 530. The third gate electrode 520 may be in contact with the third work function adjusting liner 530. The third gate electrode 520 may include a third conductive liner 521 and a third upper electrode 522. The third conductive liner 521 may be formed on the third work function adjusting liner 530. The third conductive liner 521 may be in contact with the third work function adjusting liner 530. The third conductive liner 521 may be formed along the third work function adjusting liner 530. The third conductive liner 521 may be formed along the periphery of the fifth and sixth multi-channel active patterns 510 and 610.

The second and third work function adjusting liners 330 and 530 may each include an insulating material. The second and third work function adjusting liners 330 and 530 may each include an insulating material having a dielectric constant that is less than the dielectric constants of the second and third high dielectric constant insulating layers 337 and 537. The second and third work function adjusting liners 330 and 530 may include, for example, silicon nitride (SiN). In the semiconductor device according to some embodiments of the present inventive concept, the second and third work function adjusting liners 330 and 530 may be silicon nitride layers, respectively.

Each of the second and third conductive liners 321 and 521 may include, for example, at least one of TiN, TiSiN, TiAl, TiAlC, TiAlN and TiAlC—N. As an example, the first region I may be a PMOS region, and the second region II may be an NMOS region. The second conductive liner 321 may include at least one of TiN and TiSiN. The third conductive liner 521 may include at least one of TiN, TiAl, TiAlC, TiAlN and TiAlC—N.

As another example, when the first region I and the second region II are the PMOS region, a threshold voltage of a p-type transistor of the first region I may be different from a threshold voltage of the p-type transistor of the second region II. The second conductive liner 321 may include TiN and the third conductive liner 521 may include TiSiN. Since the second conductive liner 321 includes a material different from the third conductive liner 521, the structure of the second conductive liner 321 may be different from the structure of the third conductive liner 521.

The second semiconductor pattern 350 may be disposed on at least one side of the second gate electrode structure 315. The third semiconductor pattern 550 may be disposed on at least one side of the third gate electrode structure 515.

Figure 19:
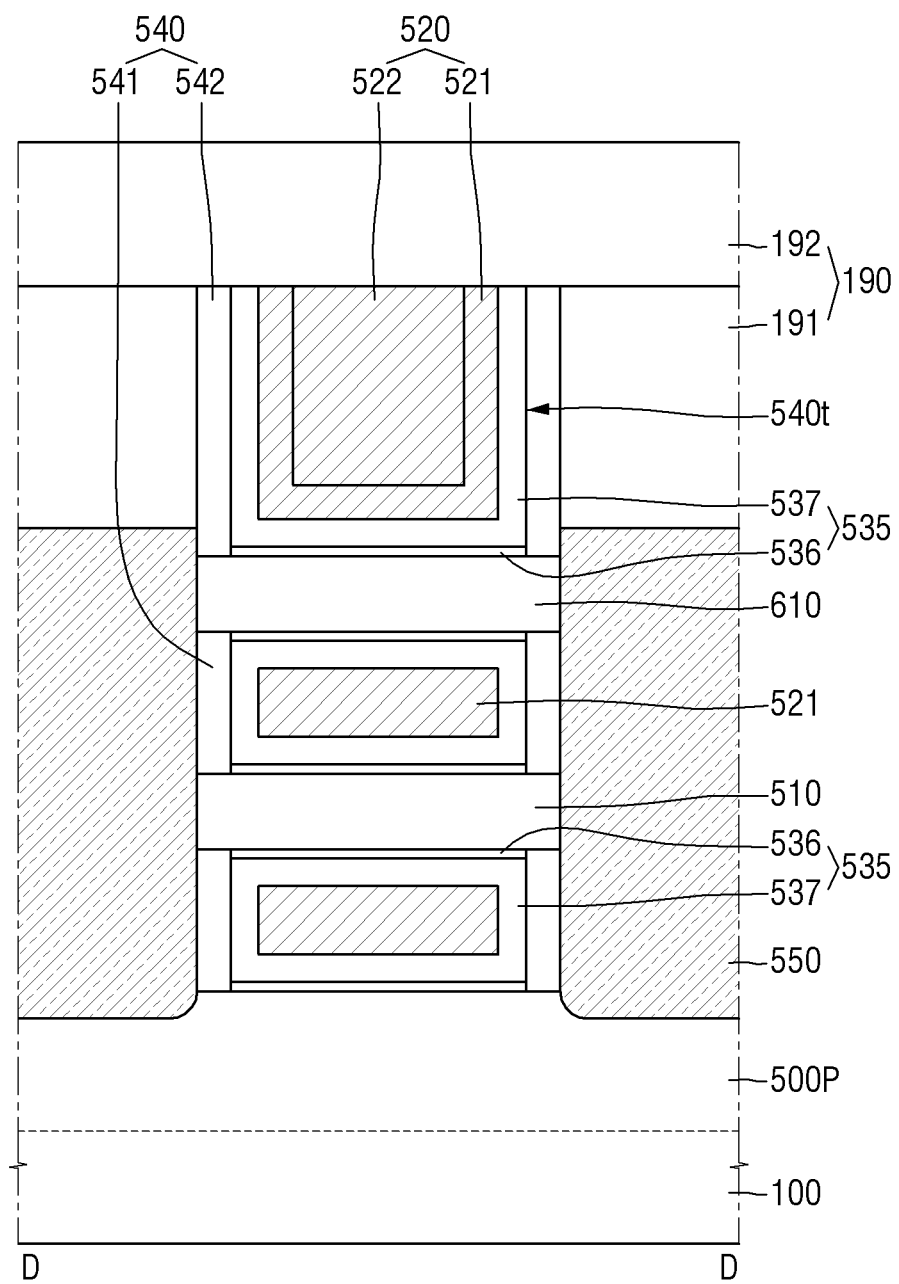
FIGS. 19 and 20 are diagrams for explaining the semiconductor device according to some embodiments of the present inventive concept, respectively.
Figure 20:
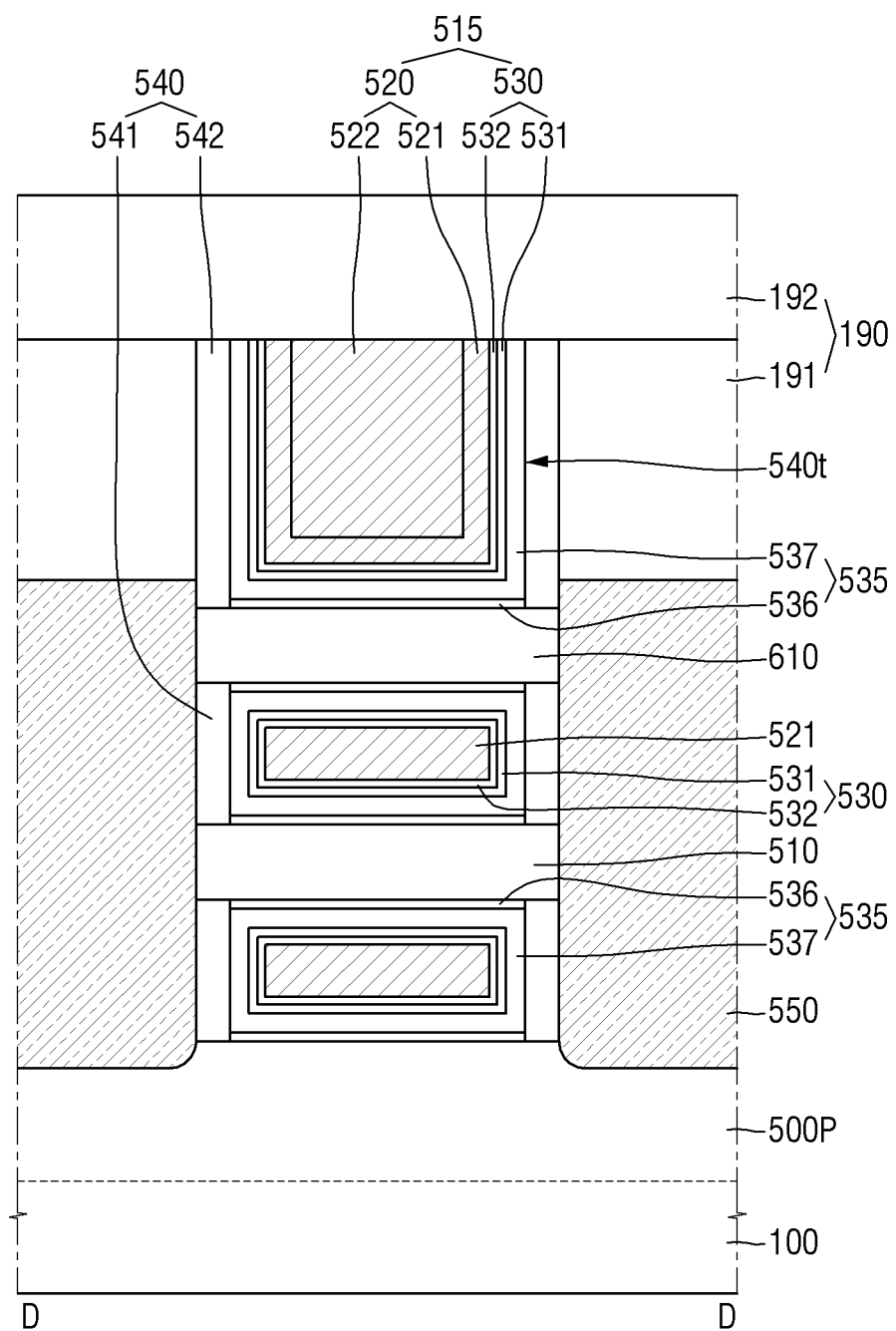

FIGS. 19 and 20 are diagrams for explaining the semiconductor device according to some embodiments of the present inventive concept, respectively. For the sake of convenience of explanation, differences from those described with reference to FIGS. 16 to 18 will be mainly described.

Referring to FIG. 19, in the semiconductor device according to some embodiments of the present inventive concept, the third conductive liner 521 may be in contact with the third high dielectric constant insulating layer 537. For example, the first region I may be a PMOS region and the second region II may be an NMOS region.

A work function adjusting liner (530 of FIG. 20) may not be formed between the third conductive liner 521 and the third high dielectric constant insulating layer 537, unlike the first region I. In other words, the third gate electrode structure (515 of FIG. 20) may not include the third work function adjusting liner 530.

Referring to FIG. 20, in the semiconductor device according to some embodiments of the present inventive concept, the third work function adjusting liner 530 may include a second lower adjusting liner 531 and a second upper adjusting liner 532. For example, the first region I may be a PMOS region, and the second region II may be an NMOS region.

The second lower adjusting liner 531 may be in contact with the third high dielectric constant insulating layer 537. The second upper adjusting liner 532 may be formed on the second lower adjusting liner 531. The second lower adjusting liner 531 may include an insulating material. The second lower adjusting liner 531 may include, for example, silicon nitride (SiN). In the semiconductor device according to some embodiments of the present inventive concept, the second lower adjusting liner 531 may be a silicon nitride layer.

As an example, the second upper adjusting liner 532 may include a layer obtained by oxidation of the material included in the second lower adjusting liner 531. For example, the second upper adjusting liner 532 may include a silicon oxynitride layer obtained by oxidation of silicon nitride. As another example, the second upper adjusting liner 532 may include a layer obtained by oxidation of the material included in the third conductive liner 521.

Figure 21:
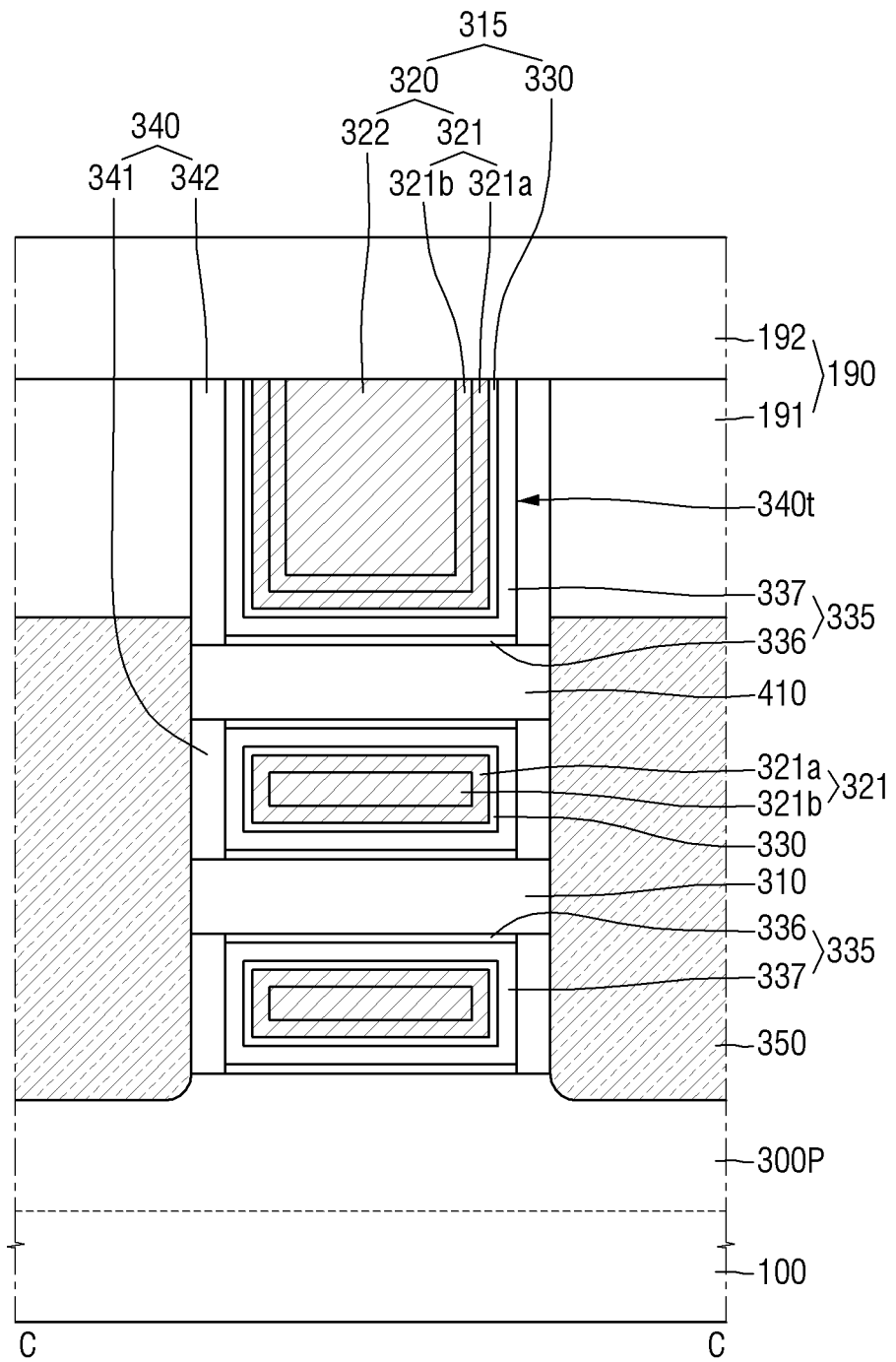
FIGS. 21 and 22 are diagrams for explaining the semiconductor device according to some embodiments of the present inventive concept, respectively.
Figure 22:
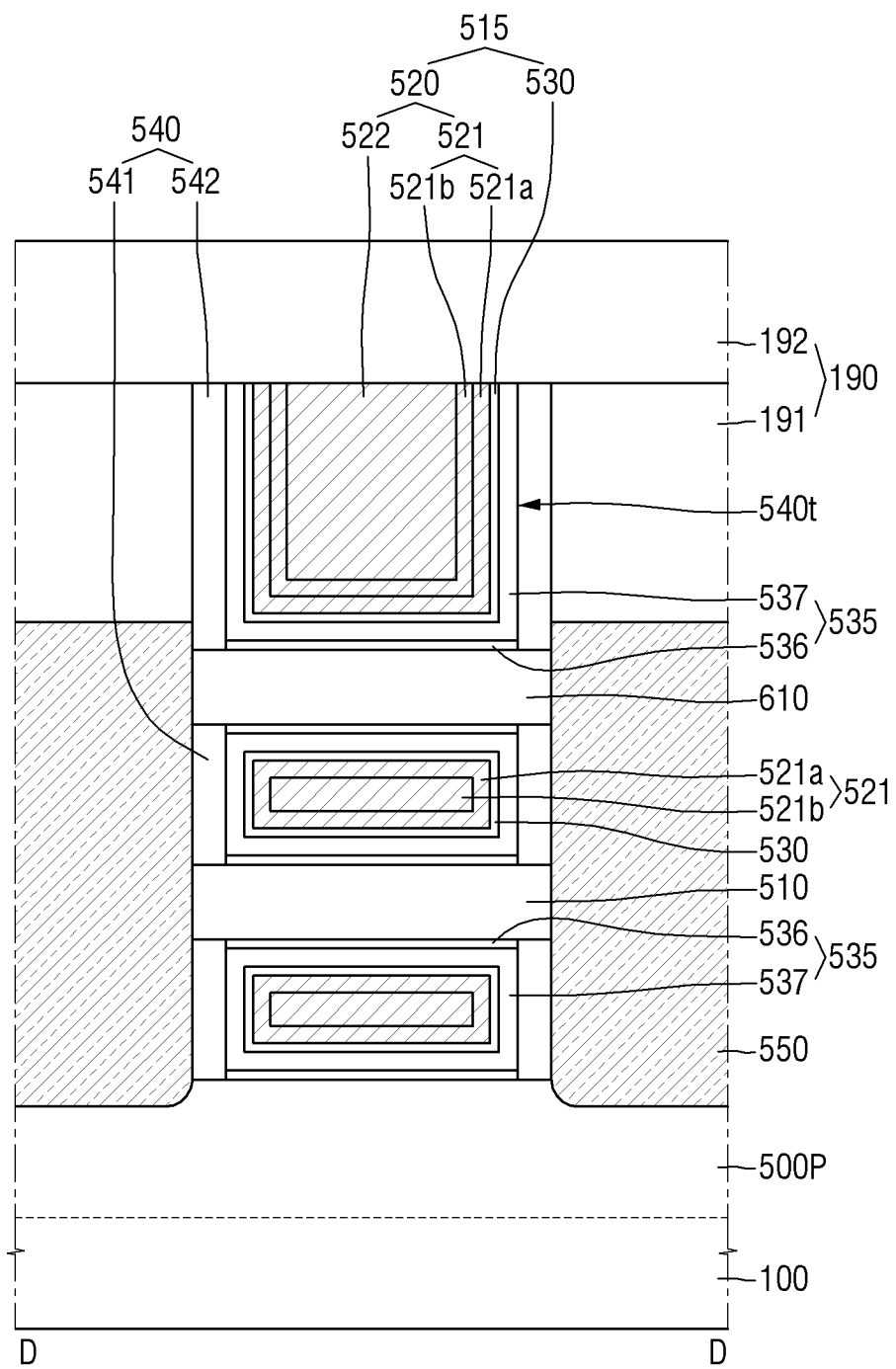

FIGS. 21 and 22 are diagrams for explaining the semiconductor device according to some embodiments of the present inventive concept, respectively. For the sake of convenience of explanation, differences from those described with reference to FIGS. 16 to 18 will be mainly described.

Referring to FIG. 21, in the semiconductor device according to some embodiments of the present inventive concept, the second conductive liner 321 may include a second lower conductive liner 321*a*, and a second upper conductive liner 321*b*. For example, the first region I may be a PMOS region, and the second region II may be an NMOS region.

The second lower conductive liner 321*a* may be in contact with the second work function adjusting liner 330. The second upper conductive liner 321*b* may be formed on the second lower conductive liner 321*a*. The second lower conductive liner 321*a* and the second upper conductive liner 321*b* may each include a conductive nitride layer. The second lower conductive liner 321*a* may include a TiN layer, and the second upper conductive liner 321*b* may include a TiSiN layer. Alternatively, the second lower conductive liner 321*a* may include a TiSiN layer, and the second upper conductive liner 321*b* may include a TiN layer.

Referring to FIG. 22, in the semiconductor device according to some embodiments of the present inventive concept, the third conductive liner 521 may include a third lower conductive liner 521*a*, and a third upper conductive liner 521*b*.

The third lower conductive liner 521*a* may be in contact with the third work function adjusting liner 530. The third upper conductive liner 521*b* may be formed on the third lower conductive liner 521*a*.

As an example, the first region I may be a PMOS region, and the second region II may be an NMOS region. The third lower conductive liner 521*a* may include a TiN layer. The third upper conductive liner 521*b* may include at least one of a TiAl layer, a TiAlC layer, a TiAlN layer and a TiAlC—N layer.

As another example, when the first region I and the second region II are the PMOS region, the threshold voltage of the p-type transistor of the first region I may be different from the threshold voltage of the p-type transistor of the second region II. The second conductive liner 321 may include one layer of the TiN layer and the TiSiN layer. The third conductive liner 521 may include a laminated conductive layer including the TiN layer and the TiSiN layer. For example, the third lower conductive liner 521*a* may include a TiN layer, and the third upper conductive liner 521*b* may include a TiSiN layer. Alternatively, the third lower conductive liner 521*a* may include a TiSiN layer and the third upper conductive liner 521*b* may include a TiN layer. Since the second conductive liner 321 has a laminated structure different from that of the third conductive liner 521, the structure of the second conductive liner 321 may be different from the structure of the third conductive liner 521.

Figure 23:
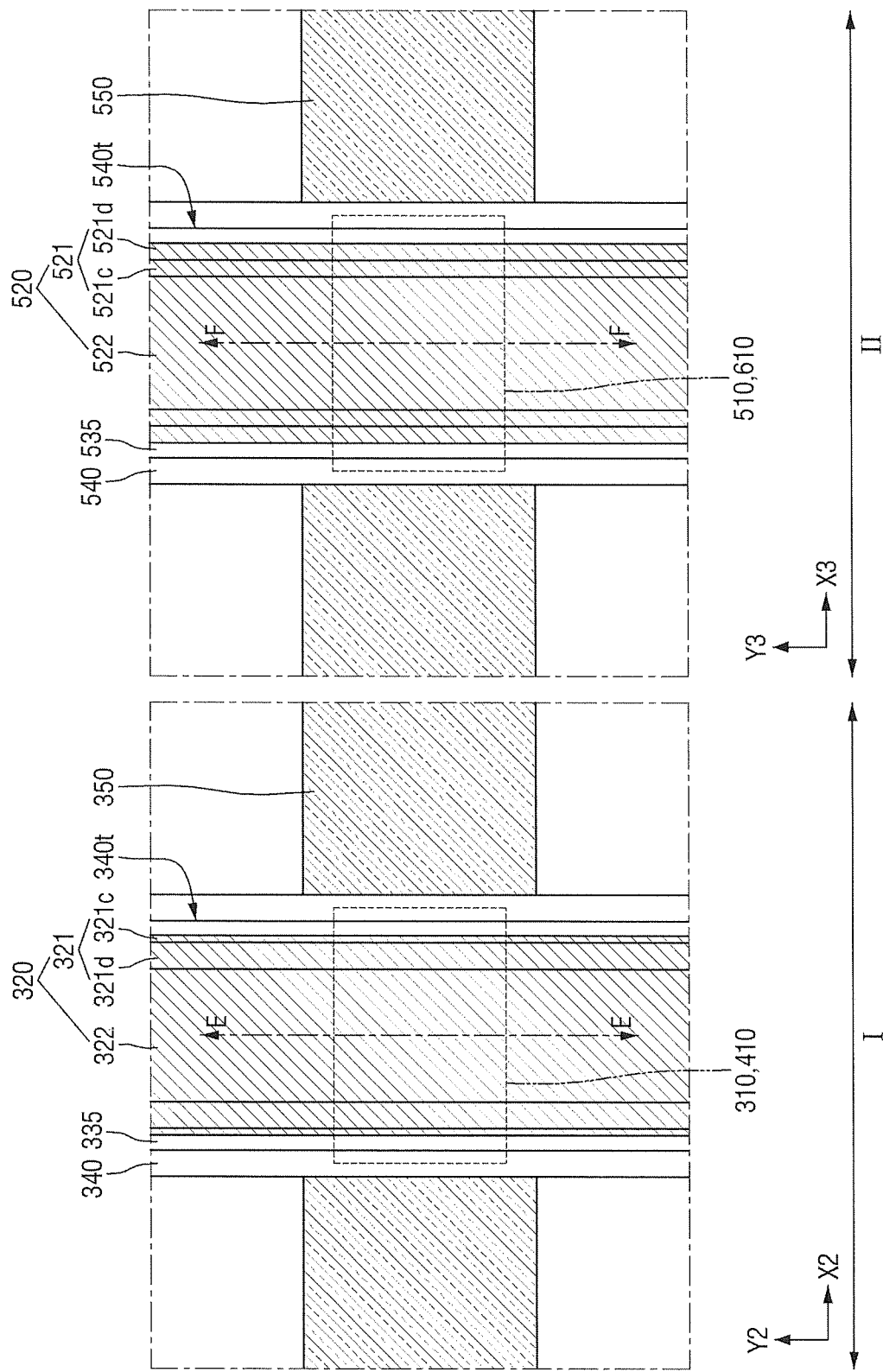
FIGS. 23 to 24D are diagrams for explaining the semiconductor device according to some embodiments of the present inventive concept.
Figure 24A:
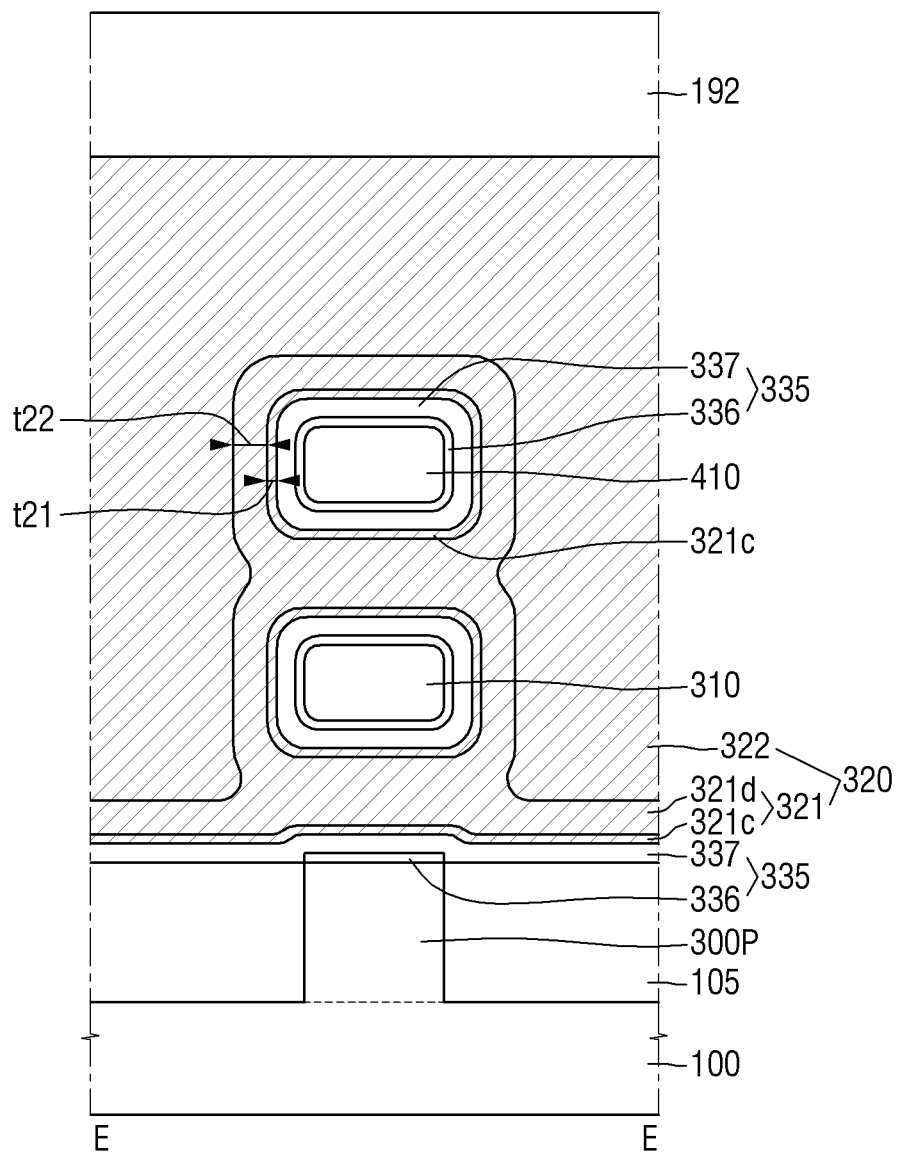
Figure 24B:
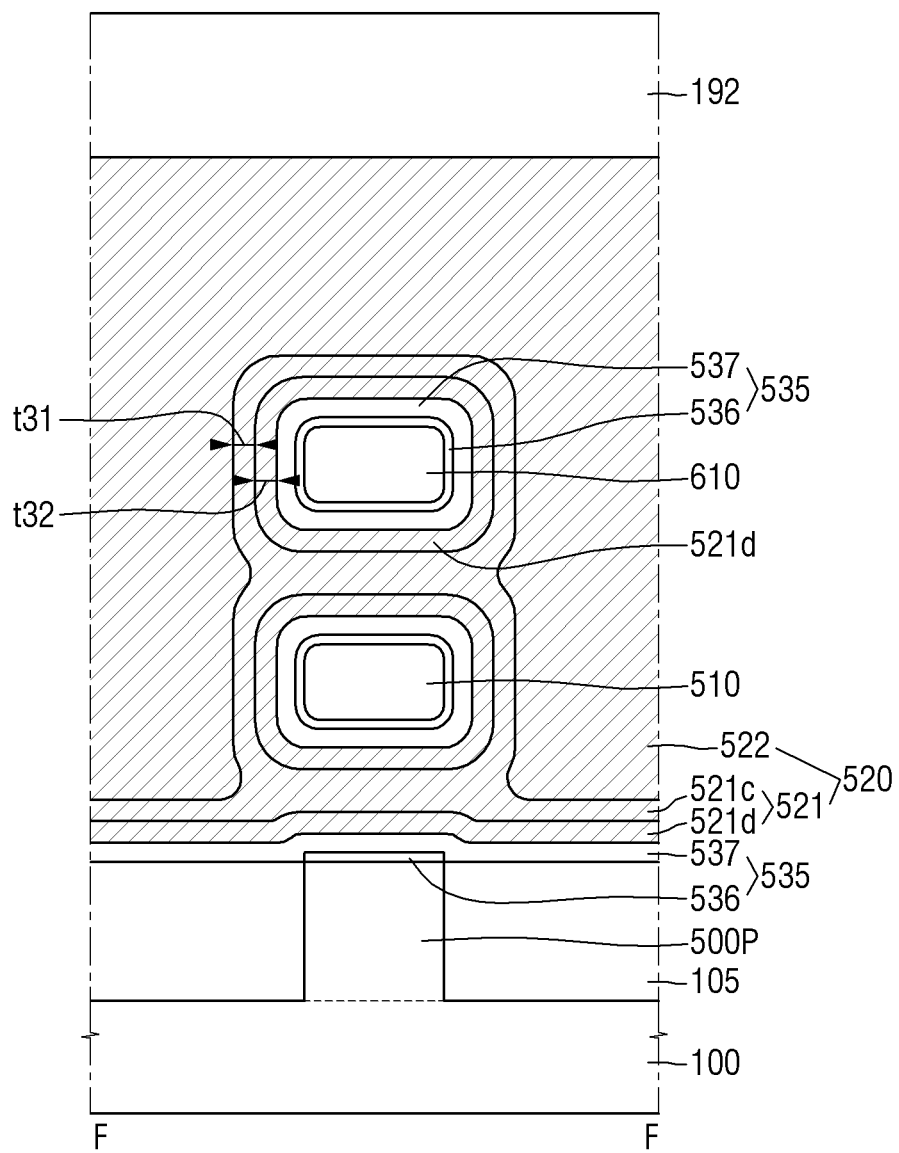
Figure 24C:
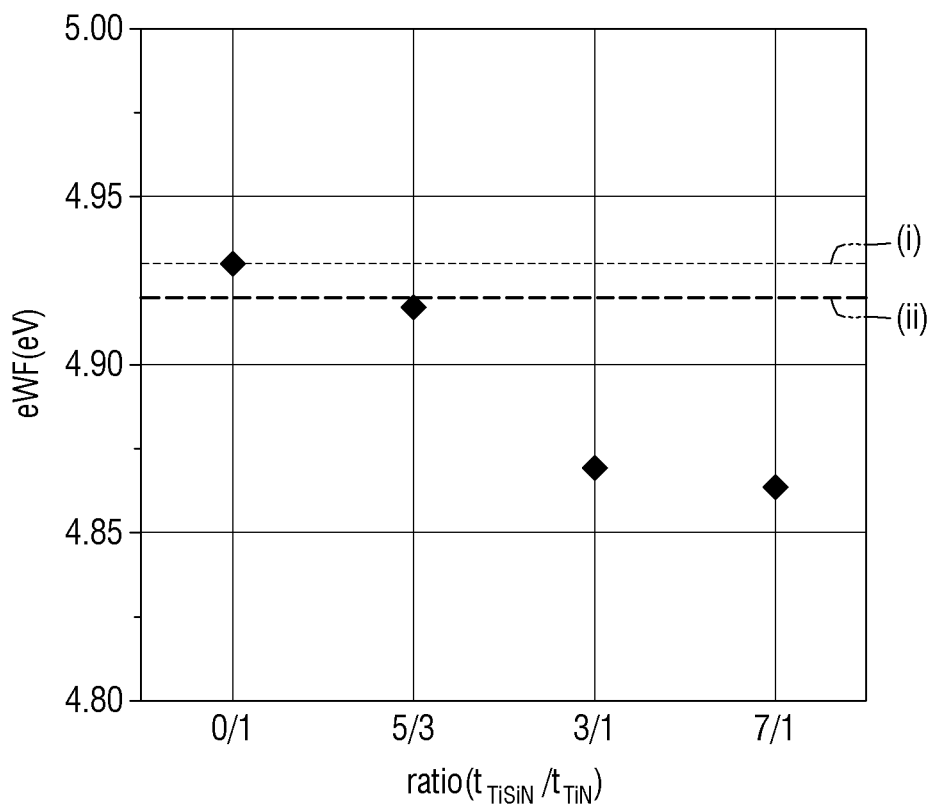
Figure 24D:
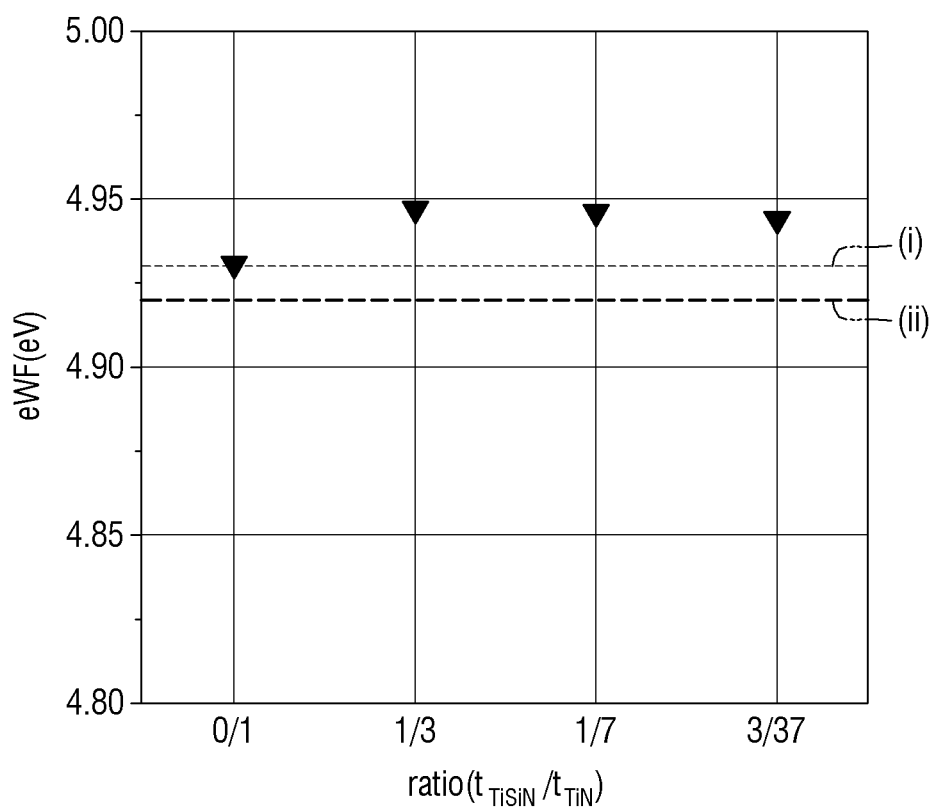

FIGS. 23 to 24D are diagrams for explaining the semiconductor device according to some embodiments of the present inventive concept. FIG. 23 is a plan view for explaining the semiconductor device according to some embodiments of the present inventive concept, and FIGS. 24A and 24B are cross-sectional views taken along lines E-E and F-F of FIG. 23. FIG. 24C is a diagram illustrating a change in the effective work function of the transistor described in FIG. 24A, and FIG. 24D is a diagram illustrating a change in effective work function of the transistor described in FIG. 24B. For the sake of convenience of explanation, differences from those described with reference to FIGS. 16 to 18 will be mainly described.

Referring to FIGS. 23 to 24D, in the semiconductor device according to some embodiments of the present inventive concept, the second gate electrode 320 may be in contact with the second high dielectric constant insulating layer 337, and the third gate electrode 520 may be in contact with the third high dielectric constant insulating layer 537. In other ways, the work function adjusting liner (330 and 530 of FIG. 16) is not formed between the second gate electrode 320 and the second gate insulating layer 335, and between the third gate electrode 520 and the third gate insulating layer 535.

The first region I and the second region II may be a PMOS region. The transistor formed in the first region I may be a first p-type transistor, and the transistor formed in the second region II may be a second p-type transistor. In the semiconductor device according to some embodiments of the present inventive concept, the threshold voltage of the first p-type transistor is greater than the threshold voltage of the second p-type transistor. For example, the first p-type transistor may be a regular voltage transistor, and the second p-type transistor may be a low voltage transistor.

The second conductive liner 321 includes a first metal nitride layer 321*c* and a first metal silicon nitride layer 321*d*. The first metal nitride layer 321*c* and the first metal silicon nitride layer 321*d* may be formed sequentially along the periphery of the third and fourth multi-channel active patterns 310 and 410, respectively. The first metal silicon nitride layer 321*d* may be formed on the first metal nitride layer 321*c*.

The third conductive liner 521 includes a second metal nitride layer 521*c* and a second metal silicon nitride layer 521*d*. The second metal silicon nitride layer 521*d* and the second metal nitride layer 521*c* may be sequentially formed along the periphery of the fifth and sixth multi-channel active patterns 510 and 610, respectively. The second metal nitride layer 521*c* may be formed on the second metal silicon nitride layer 521*d*. Each of the first and second metal nitride layers 321*c* and 521*c* may be, for example, a titanium nitride layer, and each of the first and second metal silicon nitride layers 321*d* and 521*d* may be a titanium silicon nitride layer.

For example, between the upper surface of the third multi-channel active pattern 310 and the lower surface of the fourth multi-channel active pattern 410, the second conductive liner 321 is formed but the second upper electrode may not be formed. Between the upper surface of the fifth multi-channel active pattern 510 and the lower surface of the sixth multi-channel active pattern 610A, the third conductive liner 521 is formed but the third upper electrode 522 may not be formed.

In the semiconductor device according to some embodiments of the present inventive concept, the second upper electrode 322 is formed along the side wall of the third multi-channel active pattern 310, the side wall of the fourth multi-channel active pattern 410 and the upper surface of the fourth-multi channel active pattern 410, and may not include a conductive insert liner containing aluminum (Al). Further, the third upper electrode 522 is formed along the side wall of the fifth multi-channel active pattern 510, the side wall of the sixth multi-channel active pattern 610, and the upper surface of the sixth multi-channel active pattern 610, and may not include a conductive insert liner containing aluminum (Al).

FIGS. 24C and 24D illustrate a change in the effective work function eWF according to a ratio of the thicknesses (t21, t31, and $t_{TiN}$) of the titanium nitride layer and the thicknesses (t22, t32, and $t_{TiSiN}$) of the titanium silicon nitride layer included in the second and third conductive liners 321 and 521.

In FIG. 24C, the ratio (t22:t21 or t22/t21) of the thickness (t22, or $t_{TiSiN}$) of the first metal silicon nitride layer 321d to the thickness (t21 or $t_{TiN}$) of the first metal nitride layer 321c may be in a range of about 5/3 to about 7. For example, by adjusting the ratio of the thickness ($t_{TiSiN}$) of the titanium silicon nitride to the thickness ($t_{TiN}$) of the titanium nitride layer, it is possible to obtain various effective work functions (values less than line (ii)) lower than the effective work function (line (i)) which uses only titanium nitride layer. Therefore, a transistor having a threshold voltage higher than the threshold voltage of a transistor including only the titanium nitride layer may be manufactured.

In FIG. 24D, the ratio (t32:t31 or t32/t31) of the thickness t32 of the second metal silicon nitride layer 521d to the thickness t31 of the second metal nitride layer 521c may be in a range of about 3/37 to about 1/3. For example, by adjusting the ratio of the thickness ($t_{TiSiN}$) of the titanium silicon nitride layer to the thickness ($t_{TiN}$) of the titanium nitride layer, it is possible to obtain various effective work functions higher than the effective work function (line (i)) which uses only titanium nitride layer. Thus, a transistor having a threshold voltage lower than the threshold voltage of a transistor including only the titanium nitride layer may be manufactured.

In each of FIGS. 24C and 24D, although the ratio of the thickness ($t_{TiN}$) of the titanium nitride layer to the thickness ($t_{TiSiN}$) of the titanium silicon nitride layer varies, the total of the thickness ($t_{TiN}$) of the titanium nitride layer and the thickness ($t_{TiSiN}$) of the titanium silicon nitride layer is the same in each test example. In FIGS. 24C and 24D, "0/1" of a horizontal axis indicates that the conductive liner includes only a titanium nitride layer without a titanium silicon nitride layer, and does not relate to a thickness of the titanium nitride layer.

Figure 25A:
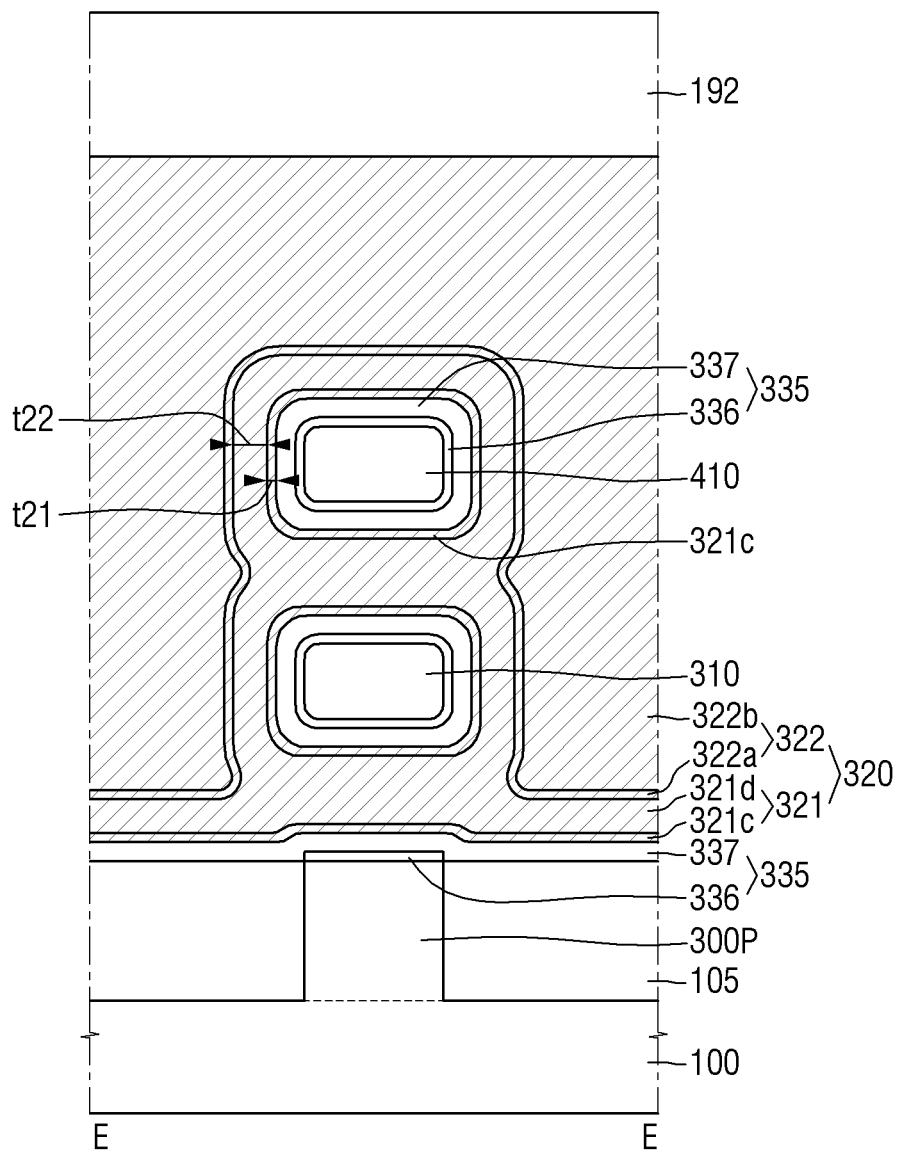
FIGS. 25A to 25D are diagrams for explaining the semiconductor device according to some embodiments of the present inventive concept.
Figure 25B:
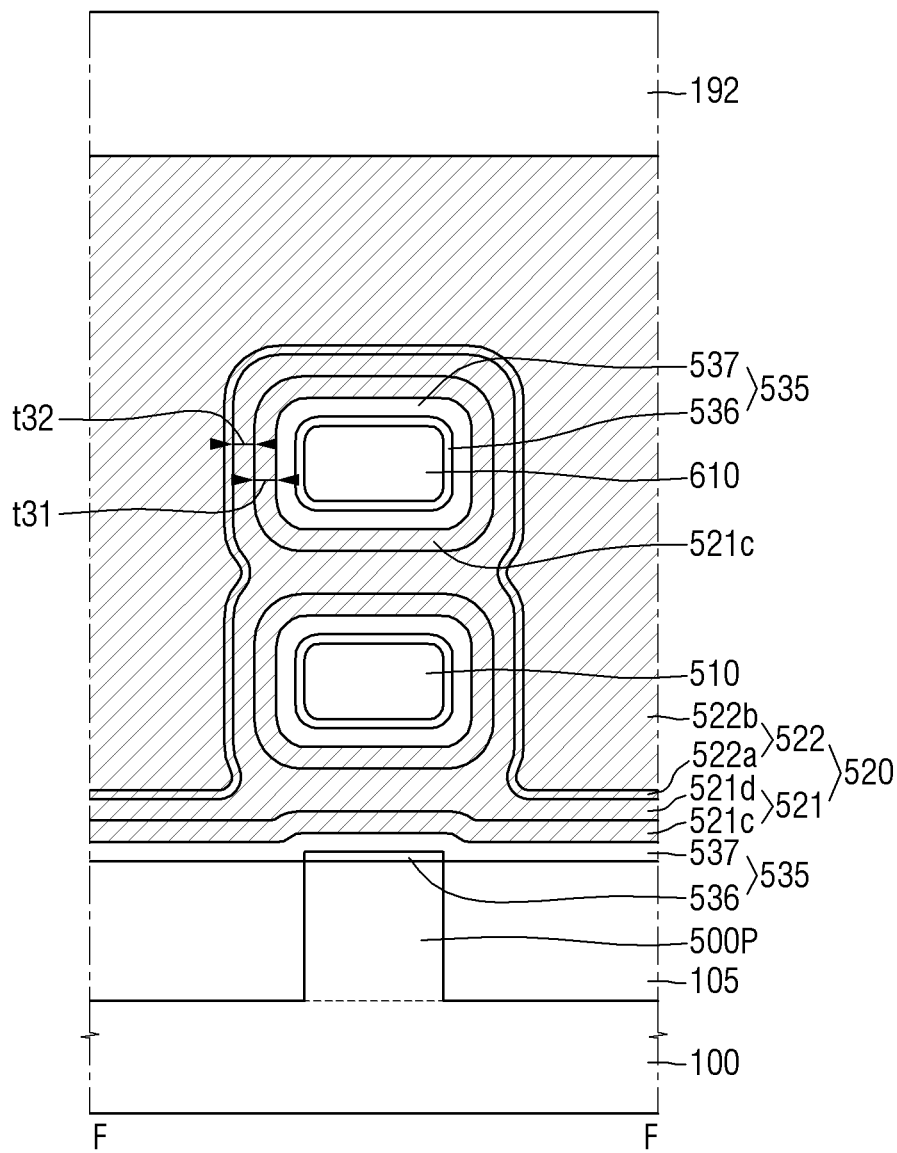
Figure 25C:
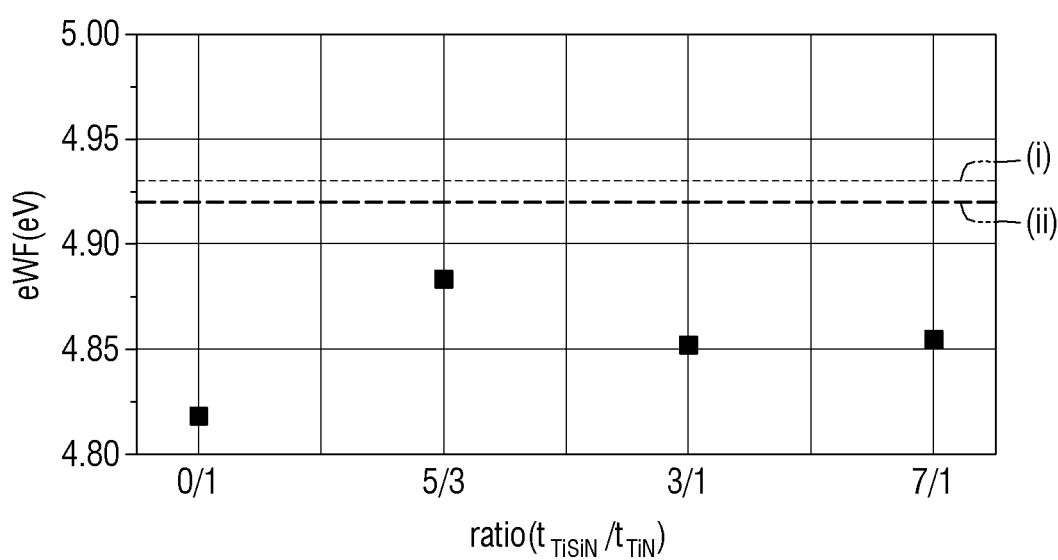
Figure 25D:
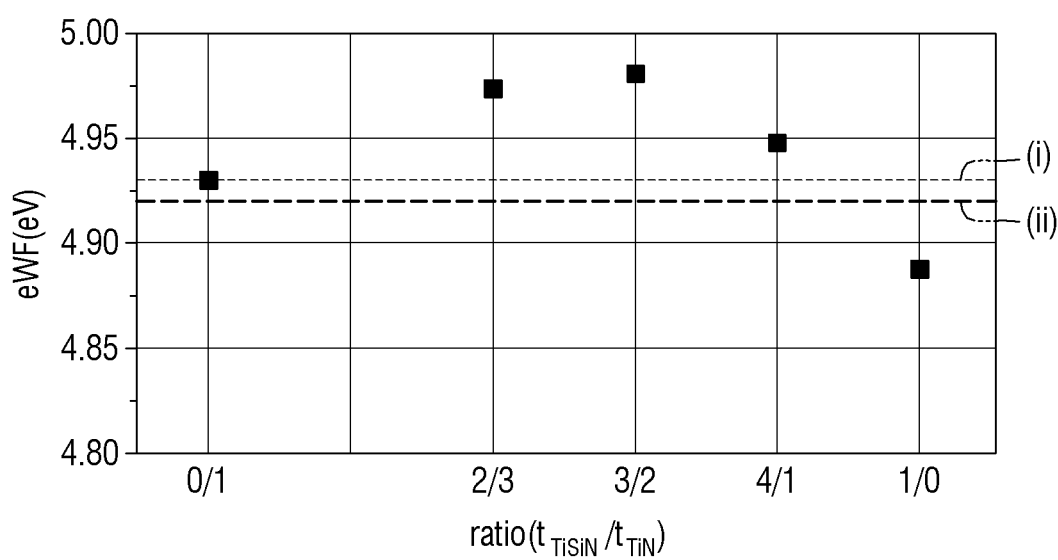

FIGS. 25A to 25D are diagrams for explaining the semiconductor device according to some embodiments of the present inventive concept. FIGS. 25A and 25B are cross-sectional views taken along lines E-E and F-F of FIG. 23, respectively. FIG. 25C is a diagram illustrating a change in the effective work function of the transistor described in FIG. 25A, and FIG. 25D is a diagram illustrating a change in effective work function of the transistor described in FIG. 25B. For the sake of convenience of explanation, differences from those described with reference to FIGS. 23 to 24D will be mainly described.

Referring to FIGS. 25A to 25D, in the semiconductor device according to some embodiments of the present inventive concept, the second upper electrode 322 includes a first conductive insertion liner 322a and a first filling layer 322b, and the third upper electrode 522 may include a second conductive insertion liner 522a and a second filling layer 522b.

In the third conductive liner 521, the second metal nitride layer 521c and the second metal silicon nitride layer 521d may be sequentially formed along the periphery of the fifth and sixth multi-channel active patterns 510 and 610, respectively. The second metal silicon nitride layer 521d may be formed on the second metal nitride layer 521c.

The first conductive insertion liner 322a may be formed on the second conductive liner 321. The first conductive insertion liner 322a may be formed along the side wall of the third multi-channel active pattern 310, the side wall of the fourth multi-channel active pattern 410 and the upper surface of the fourth multi-channel active pattern 410. The first filling layer 322b may be formed on the first conductive insertion liner 322a.

The second conductive insertion liner 522a may be formed on the third conductive liner 521. The second conductive insertion liner 522a may be formed along the side wall of the fifth multi-channel active pattern 510, the side wall of the sixth multi-channel active pattern 610 and the upper surface of the sixth multi-channel active pattern 610. The second filling layer 522b may be formed on the second conductive insertion liner 522a.

The first and second conductive insertion liners 322a and 522a may each include a conductive material including aluminum (Al). The first and second conductive insert liners 322a and 522a may each include, but is not limited to, at least one of TiAl, TiAlC, TiAlN and TiAlC—N, respectively.

FIGS. 25C and 25D illustrate a change in the effective work function eWFT according to the ratio of the thickness (t21, t31, and $t_{TiN}$) of the titanium nitride layer and the thickness (t22, t32, and $t_{TiSiN}$) of the titanium silicon nitride layer included in the second and third conductive liners 321 and 521.

In FIG. 25C, the ratio (t22:t21 or t22/t21) of the thickness (t22 or $t_{TiSiN}$) of the first metal silicon nitride layer 321d to the thickness (t21 or $t_{TiN}$) of the first metal nitride layer 321c may be in a range of about 5/3 to about 7. For example, various effective work functions lower than the line (ii) may be obtained by adjusting the ratio of the thickness ($t_{TiSiN}$) of the titanium silicon nitride layer to the thickness ($t_{TiN}$) of the titanium nitride layer. Also, by adjusting the ratio of the thickness ($t_{TiSiN}$) of the titanium silicon nitride layer to the thickness ($t_{TiN}$) of the titanium nitride layer, an effective work function higher than the effective work function using only the titanium nitride layer may be obtained. As a result, various transistors having a threshold voltage lower than the threshold voltage of the transistor including only the titanium nitride layer may be manufactured.

In FIG. 25D, the ratio (t32:t31 or t32/t31) of the thickness t32 of the second metal silicon nitride layer 521d to the thickness t31 of the second metal nitride layer 521c may be in a range of about 2/3 to about 4. For example, by adjusting the ratio of the thickness ($t_{TiSiN}$) of the titanium silicon nitride layer to the thickness ($t_{TiN}$) of the titanium nitride layer, various effective work function higher than the effective work function (line (i)) using only the titanium nitride layer may be obtained. Also, by adjusting the ratio of the thickness ($t_{TiSiN}$) of the titanium silicon nitride layer to the thickness ($t_{TiN}$) of the titanium silicon nitride layer, it is possible to obtain an effective work function higher than the effective work function using only the titanium silicon nitride layer. As a result, various transistors having a threshold voltage lower than the threshold voltage of the transistor including only the titanium nitride layer and the transistor including only the titanium silicon nitride layer may be manufactured.

In FIGS. 25C and 25D, the titanium silicon nitride layer may prevent diffusion of aluminum (Al) contained in the first and second conductive insertion liners 322a and 522a. As a result, the effective work function may increase. However, when the thickness ratio of the titanium silicon nitride layer increases, the tendency for exhibiting the effective work function of the titanium silicon nitride itself may predominate over the effect of preventing the diffusion of aluminum (Al).

In each of FIGS. 25C and 25D, although the ratio of the thickness ($t_{TiN}$) of the titanium nitride layer to the thickness ($t_{TiSiN}$) of the titanium silicon nitride layer varies, the total of the thickness ($t_{TiN}$) of the titanium nitride layer and the thickness ($t_{TiSiN}$) of the titanium silicon nitride layer is the same in each test example. In FIGS. 25C and 25D, "0/1" on the horizontal axis indicates that the conductive liner includes a titanium nitride layer without a titanium silicon nitride layer, and does not relate to a thickness of the titanium nitride layer. Further, in FIG. 25D, "1/O" on the horizontal axis indicates that the conductive liner includes a titanium silicon nitride layer without a titanium nitride layer, and does not relate to a thickness of the titanium silicon nitride layer.

Figure 26:
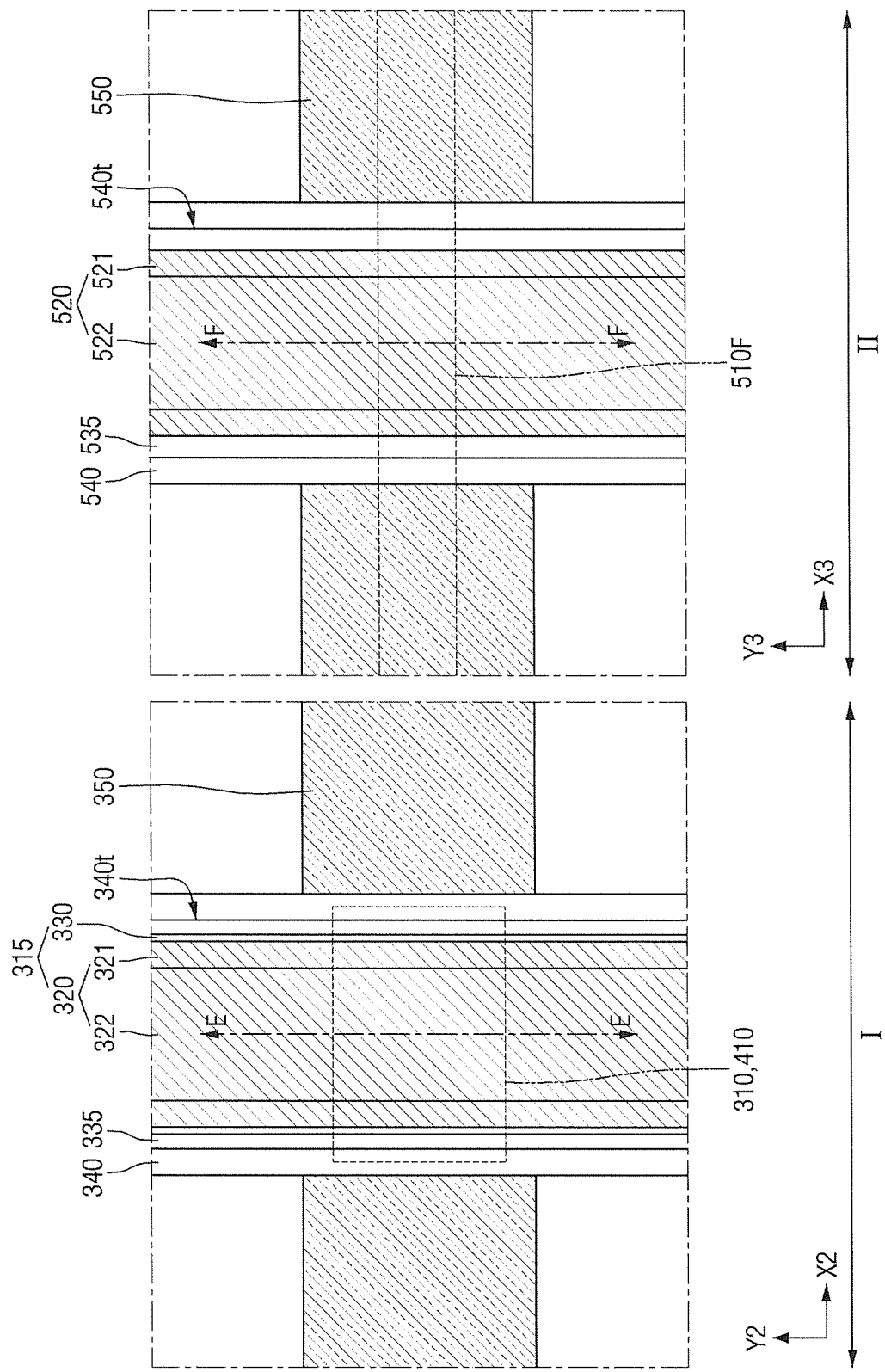
FIGS. 26 to 28 are diagrams for explaining the semiconductor device according to some embodiments of the present inventive concept.
Figure 27:
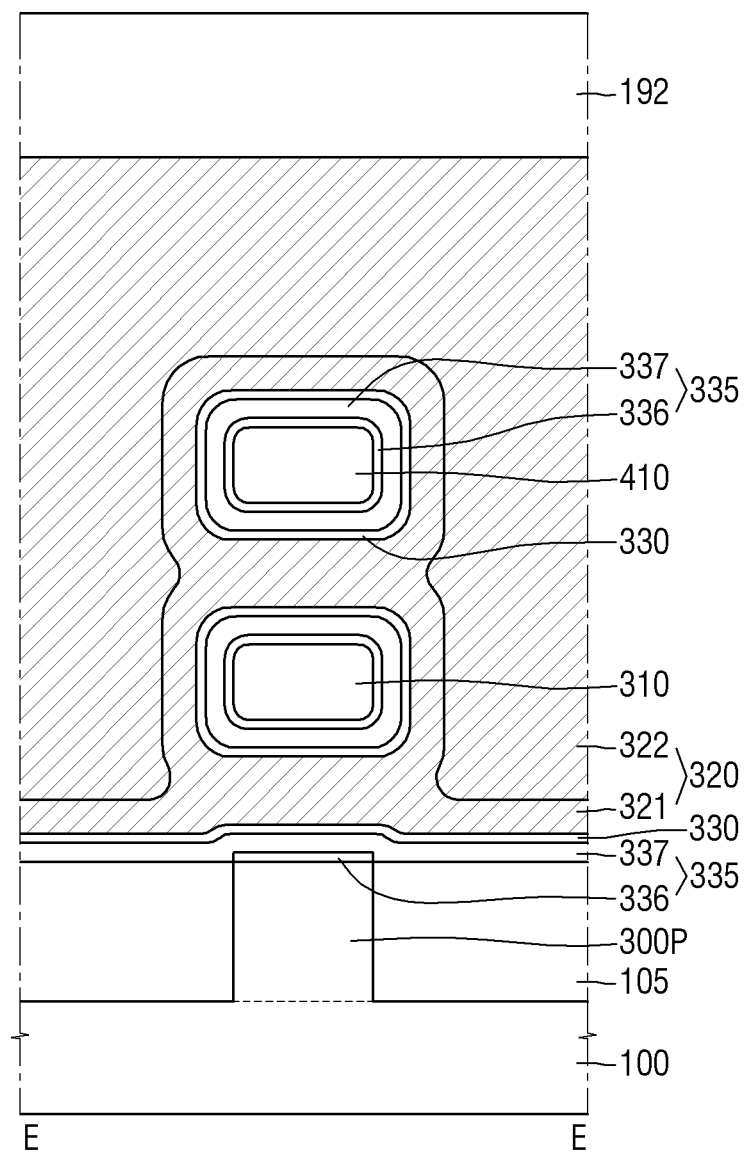
Figure 28:
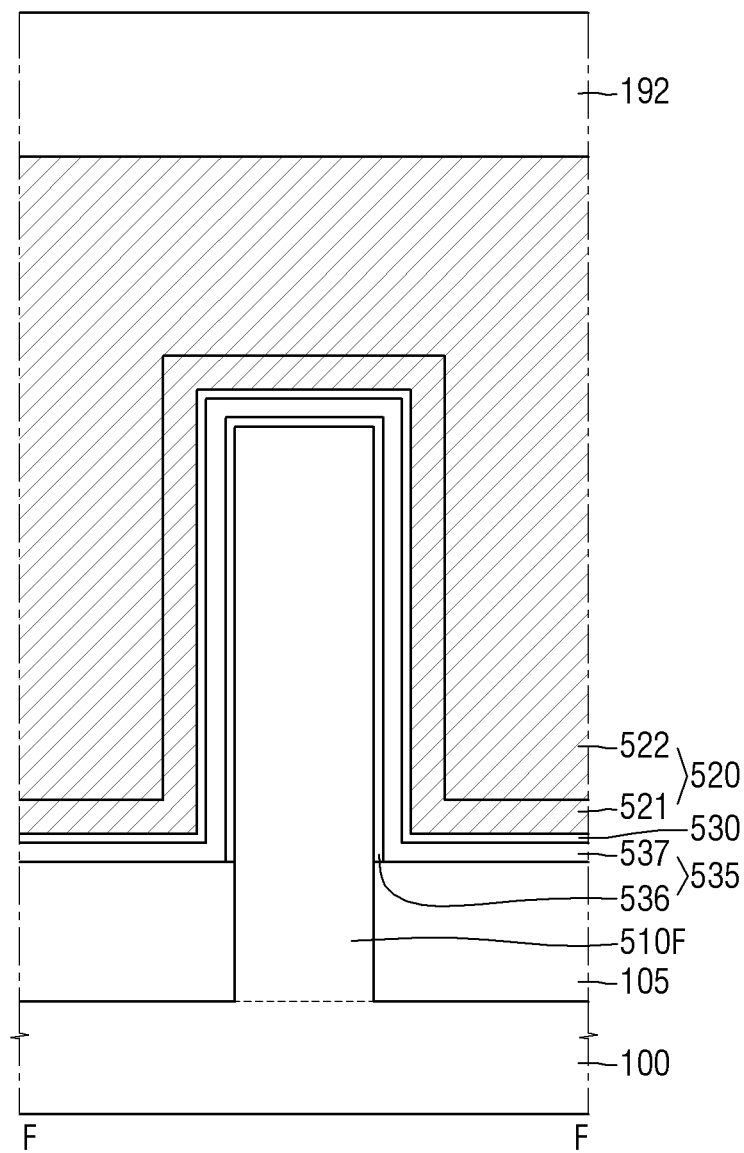

FIGS. 26 to 28 are diagrams for explaining the semiconductor device according to some embodiments of the present inventive concept. FIG. 26 is a plan view for explaining the semiconductor device according to some embodiments of the present inventive concept, and FIGS. 27 and 28 are cross-sectional views taken along lines E-E and F-F of FIG. 26. For reference, the contents which may overlap those described with reference to FIGS. 16 to 18 will be briefly explained or omitted.

Referring to FIGS. 26 to 28, in the semiconductor device according to some embodiments of the present inventive concept, the multi-channel active pattern may be the second fin-type pattern 510F in the second region II.

A part of the second fin-type pattern 510F may protrude upward from the upper surface of the field insulating layer 105. The second fin-type pattern 510F may include silicon or germanium which is an element semiconductor material. Further, the second fin-type pattern 510F may include, for example, a group IV-IV compound semiconductor or a group III-V compound semiconductor. The third interfacial layer 536 may be formed along the profile of the second fin-type pattern 510F protruding upward from the upper surface of the field insulating layer 105. The third high dielectric constant insulating layer 537, the third work function adjusting liner 530, and the third conductive liner 521 may be formed along the profile of the second fin-type pattern 510F and the upper surface of the field insulating layer 105.

Each of the first region I and the second region II may be any one of an SRAM region, a logic region, and an I/O region. For example, the first region I may be a region that performs function different from the second region II.

FIGS. 29 to 34 are intermediate step diagrams for explaining a method of manufacturing the semiconductor device according to some embodiments of the present inventive concept. FIGS. 30 to 34 illustrate a manufacturing method performed, using the cross-sectional view taken along the line G-G of FIG. 29. The semiconductor device manufactured using FIGS. 29 to 34 may be one described with reference to FIGS. 1 to 3.

Figure 29:
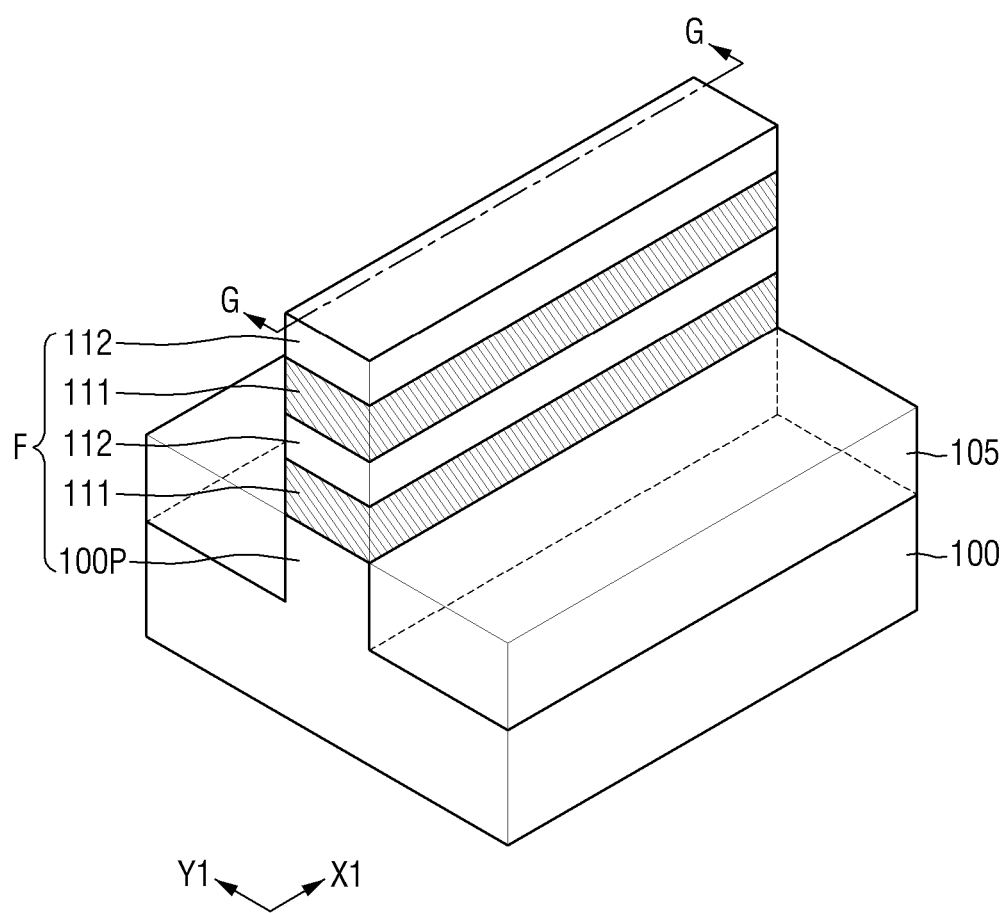
FIGS. 29 to 34 are intermediate step diagrams for explaining a method for manufacturing a semiconductor device according to some embodiments of the present inventive concept.

Referring to FIG. 29, a fin-type structure F may be formed on a substrate 100. The fin-type structure F may extend long in the first direction X1.

The fin-type structure F may include a first fin-type protrusion 100P, a sacrificial pattern 111, an active pattern 112, a sacrificial pattern 111 and an active pattern 112 sequentially stacked on the substrate 100. Since the fin-type structure F extends in the first direction X1, each of the sacrificial pattern 111 and the active pattern 112 may extend in the first direction X1. The active pattern 112 may include a material having an etching selection ratio to the sacrificial pattern 111. A field insulating layer 105 which covers at least a part of the side wall of the fin-type structure F may be formed on the substrate 100.

In FIG. 29, the active pattern 112 is illustrated as being located at the uppermost part of the fin-type structure F, but the present inventive concept is not limited thereto. Further, although the fin-type structure F is illustrated to include three active patterns 112 formed on the substrate 100, but is not limited thereto.

Figure 30:
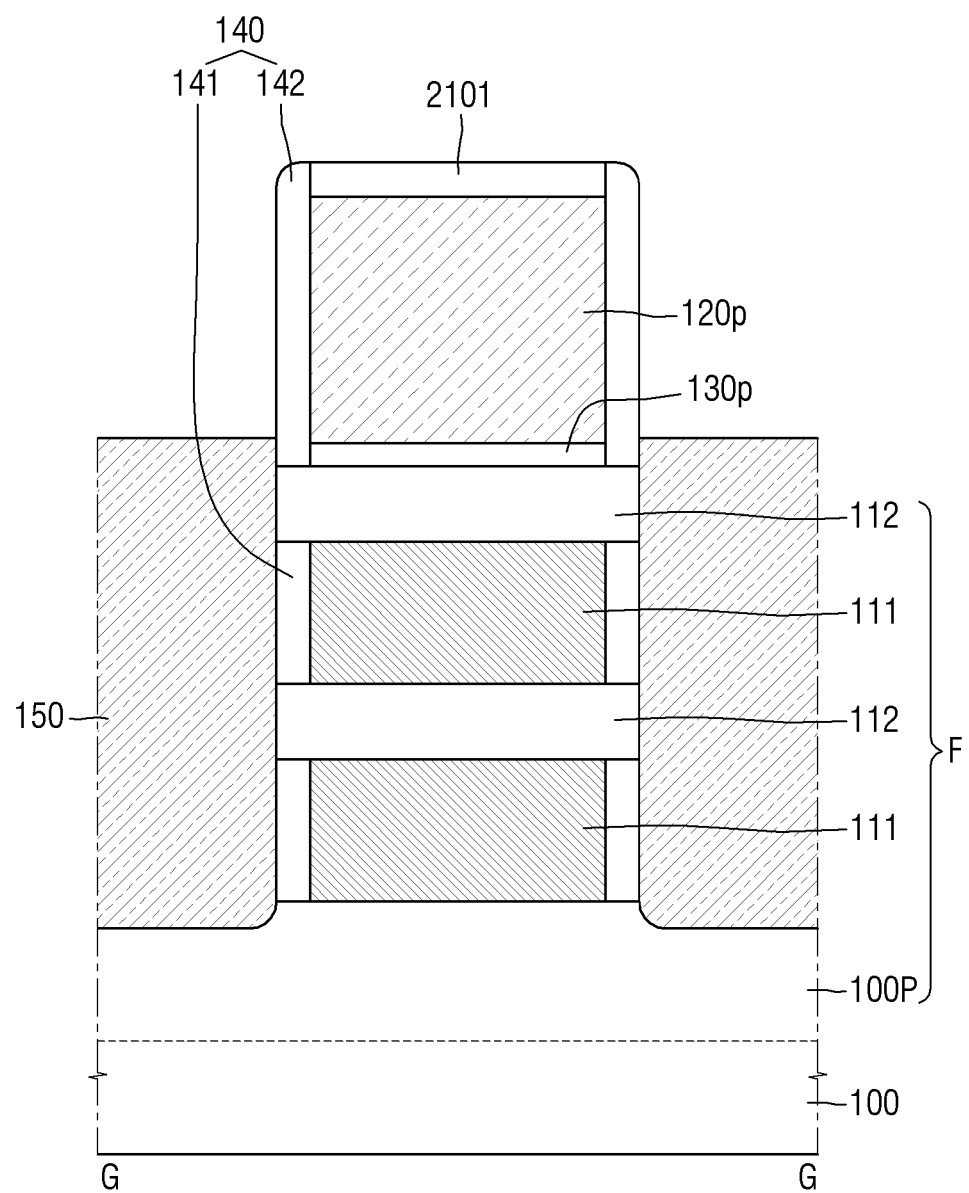

Referring to FIG. 30, a dummy gate electrode 120p intersecting the fin-type structure F and extending in the second direction (Y1 of FIG. 1) may be formed.

A dummy gate insulating layer 130p may be formed between the dummy gate electrode 120p and the fin-type structure F. A hard mask pattern 2101 may be located on the dummy gate electrode 120p. An outer spacer 142 may be formed on the side wall of the dummy gate electrode 120p. A part of the fin-type structure F may be removed, by using the dummy gate electrode 120p and the outer spacer 142 as a mask.

After removing a part of the fin-type structure F, an inner spacer 141 is formed between the active pattern 112 and the first fin-type protrusion 100P. An outer spacer 142 is also formed between the active patterns 112 on the first fin-type protrusion 100P. Thus, the gate spacer 140 is formed. For example, at least a part of the sacrificial pattern 111 overlapping the outer spacer 142 may be removed, using, for example, the etching selection ratio between the active pattern 112 and the sacrificial pattern 111. An inner spacer 141 may be formed on a portion from which a part of the sacrificial pattern 111 is removed.

Subsequently, the first semiconductor pattern 150 may be formed on the substrate 100 on both sides of the dummy gate electrode 120p and the gate spacer 140. The first semiconductor pattern 150 may be formed on the first fin-type protrusion 100P. The first semiconductor pattern 150 may be connected to the active pattern 112.

Figure 31:
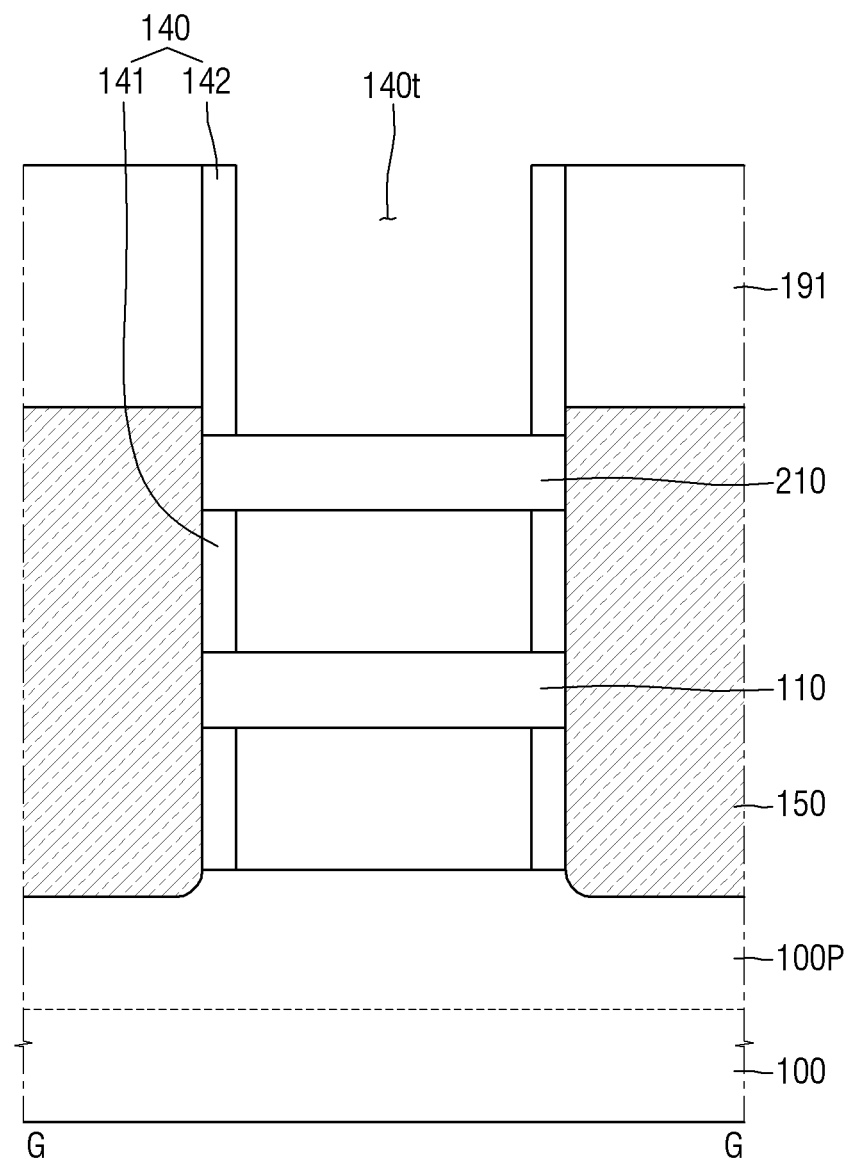

Referring to FIGS. 30 and 31, a lower interlayer insulating layer 191 may be formed on the first semiconductor pattern 150. The dummy gate electrode 120p may be exposed by the lower interlayer insulating layer 191. During formation of the lower interlayer insulating layer 191, the hard mask pattern 2101 may be removed.

Subsequently, by removing the dummy gate electrode 120p, the dummy gate insulating layer 130p and the sacrificial pattern 111, it is possible to form the first and second multi-channel active patterns 110 and 210 sequentially disposed on the substrate 100. The first multi-channel active pattern 110 may be formed to be spaced apart from the first fin-type protrusion 100P. The first gate trench 140t defined by the gate spacer 140 may be formed, by removing the dummy gate electrode 120p, the dummy gate insulating layer 130p and the sacrificial pattern 111.

Figure 32:
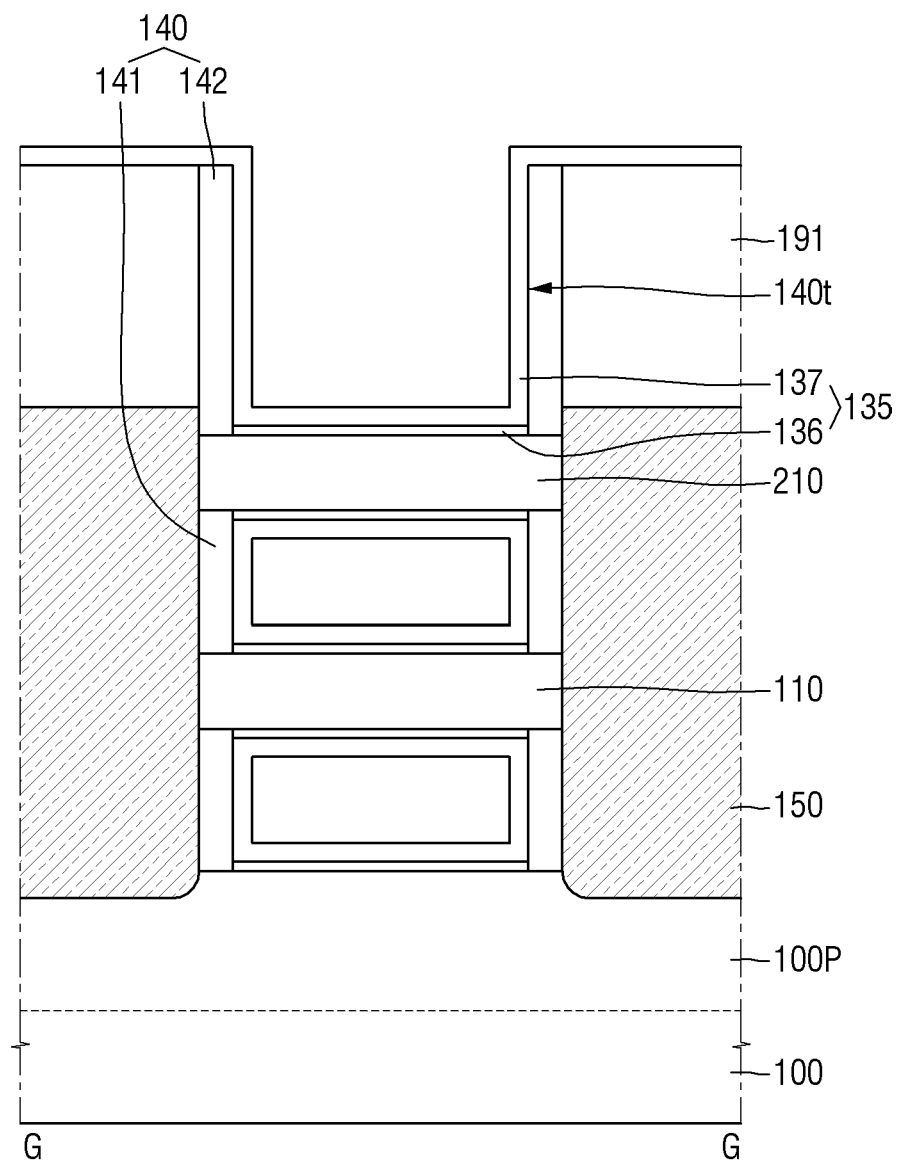

Referring to FIG. 32, a first gate insulating layer 135 is formed along the first and second multi-channel active patterns 110 and 210.

The first gate insulating layer 135 may be formed on side walls and a bottom surface of the first gate trench 140t and the periphery of the first and second multi-channel active patterns 110 and 210. The first gate insulating layer 135 includes a first interfacial layer 136 and a first high dielectric constant insulating layer 137. The first high dielectric constant insulating layer 137 may also be formed on the upper surface of the lower interlayer insulating layer 191.

Figure 33:
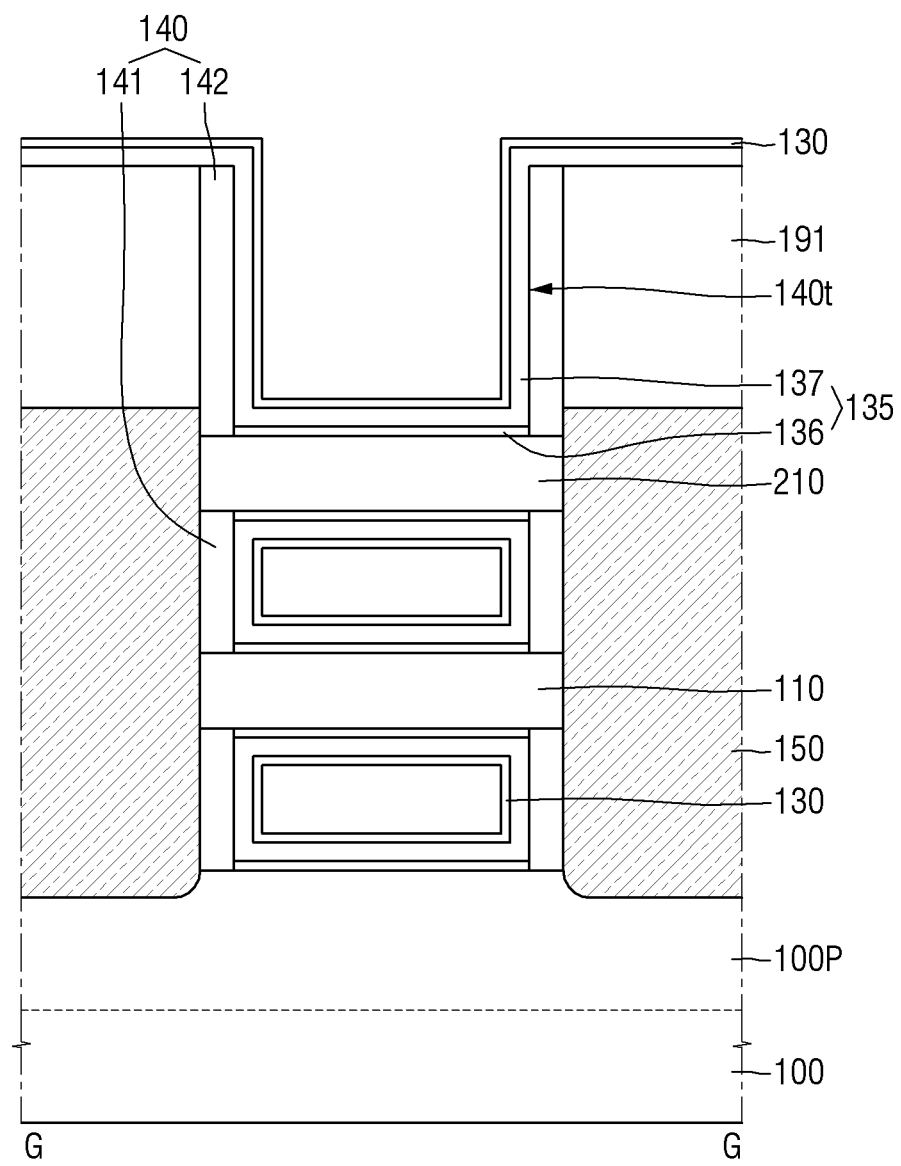

Referring to FIG. 33, a first work function adjusting liner 130 is formed on the first gate insulating layer 135.

The first work function adjusting liner 130 may be formed along the profile of the first high dielectric constant insulating layer 137. The first work function adjusting liner 130 may also be formed on the upper surface of the lower interlayer insulating layer 191. The first work function adjusting liner 130 may be formed using, for example, an atomic layer deposition, but is not limited thereto.

Figure 34:
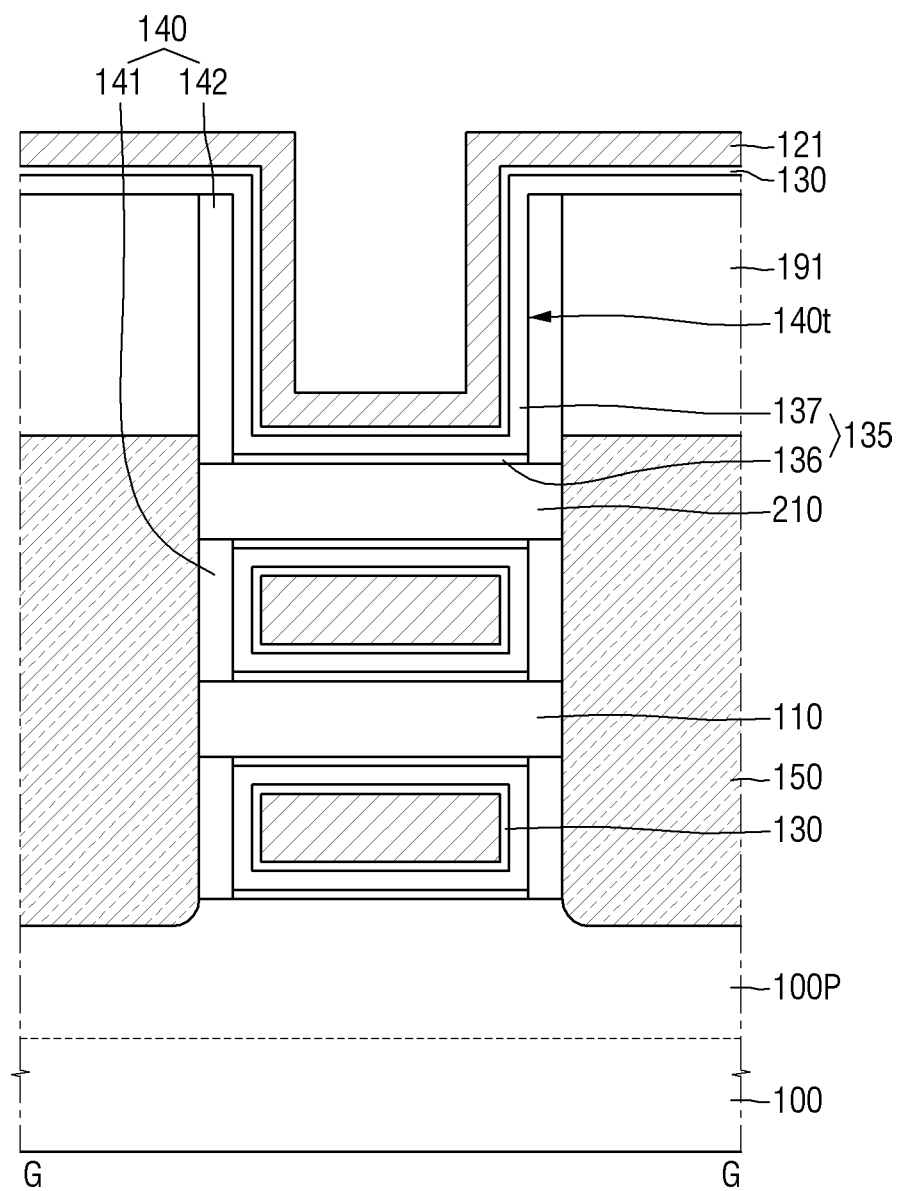

Referring to FIG. 34, the first conductive liner 121 is formed on the first work function adjusting liner 130.

The first conductive liner 121 may be formed along the profile of the first work function adjusting liner 130. The first conductive liner 121 may be formed by, for example, an atomic layer deposition, but is not limited thereto.

A first upper electrode 122 for filling the first gate trench 140t may be formed on the first conductive liner 121. Subsequently, the first high dielectric constant insulating layer 137, the first work function adjusting liner 130, the first conductive liner 121 and the first upper electrode 122 on the upper surface of the lower interlayer insulating layer 191 may be removed.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
a substrate comprising a first region and a second region;
a first multi-channel active pattern on the substrate in the first region;
a first high dielectric constant insulating layer formed along the first multi-channel active pattern on the first multi-channel active pattern, wherein the first high dielectric constant insulating layer comprises a metal;
a first gate electrode structure comprising a first silicon nitride layer and a first conductive liner, the first silicon nitride layer and the first conductive liner are formed along the first high dielectric constant insulating layer on the first high dielectric constant insulating layer, the first conductive liner being disposed on the first silicon nitride layer;
a second multi-channel active pattern on the substrate in the second region;
a second high dielectric constant insulating layer formed along the second multi-channel active pattern on the second multi-channel active pattern, wherein the second high dielectric constant insulating layer comprises a metal; and
a second gate electrode structure comprising a second conductive liner formed along the second high dielectric constant insulating layer on the second high dielectric constant insulating layer,
wherein the first conductive liner comprises a first titanium nitride (TiN) layer and a first titanium silicon nitride (TiSiN) layer stacked on each other, and
wherein a thickness of the first TiN layer is different from a thickness of the first TiSiN layer.

2. The semiconductor device of claim 1, wherein the first high dielectric constant insulating layer is in contact with the first silicon nitride layer.

3. The semiconductor device of claim 1, wherein the first silicon nitride layer is in contact with the first conductive liner.

4. The semiconductor device of claim 1, wherein the second gate electrode structure comprises no silicon nitride layer formed along the second high dielectric constant insulating layer on the second high dielectric constant insulating layer.

5. The semiconductor device of claim 4, wherein the second high dielectric constant insulating layer is in contact with the second conductive liner.

6. The semiconductor device of claim 1, wherein the second gate electrode structure further comprises a second silicon nitride layer being in contact with the second high dielectric constant insulating layer between the second high dielectric constant insulating layer and the second conductive liner.

7. The semiconductor device of claim 6, wherein the second gate electrode structure further comprises an insertion layer between the second silicon nitride layer and the second conductive liner, and
wherein the insertion layer comprises at least one of an oxide of the second silicon nitride layer and an oxide of the second conductive liner.

8. The semiconductor device of claim 6, wherein the second silicon nitride layer is in contact with and the second conductive liner.

9. The semiconductor device of claim 1, wherein each of the first multi-channel active pattern and the second multi-channel active pattern comprises at least one nanowire.

10. The semiconductor device of claim 1, wherein the first region is a p-type metal oxide semiconductor (PMOS) region and the second region is an n-type metal oxide semiconductor (NMOS) region.

11. The semiconductor device of claim 1, wherein the second conductive liner comprises a second titanium nitride (TiN) layer and a second titanium silicon nitride (TiSiN) layer stacked on each other, and
wherein a thickness of the second TiN layer is different from a thickness of the second TiSiN layer.

12. The semiconductor device of claim 11, wherein a ratio of the thickness of the second TiSiN layer to the thickness of the second TiN layer is different from a ratio of the thickness of the first TiSiN layer to the thickness of the first TiN layer.

13. The semiconductor device of claim 1, wherein the second conductive liner comprises a second titanium nitride (TiN) layer and a conductive insertion layer comprising aluminum (Al) stacked on each other.

14. A semiconductor device comprising:
a substrate comprising a first region and a second region;
a first multi-channel active pattern on the substrate in the first region;
a first high dielectric constant insulating layer formed along the first multi-channel active pattern on the first multi-channel active pattern, wherein the first high dielectric constant insulating layer comprises a metal;
a first gate electrode structure comprising a first silicon nitride layer and a first conductive liner, wherein the first silicon nitride layer and the first conductive liner are formed along the first high dielectric constant insulating layer on the first high dielectric constant insulating layer, the first conductive liner being disposed on the first silicon nitride layer;
a second multi-channel active pattern on the substrate in the second region;

a second high dielectric constant insulating layer formed along the second multi-channel active pattern on the second multi-channel active pattern, wherein the second high dielectric constant insulating layer comprises a metal; and a second gate electrode structure comprising a second silicon nitride layer and a second conductive liner, the second silicon nitride layer and the second conductive liner are formed along the second high dielectric constant insulating layer on the second high dielectric constant insulating layer, the second conductive liner being disposed on the second silicon nitride layer, and a structure of the second conductive liner being different from a structure of the first conductive liner, wherein the first conductive liner comprises a first titanium nitride (TiN) layer and a first titanium silicon nitride (TiSiN) layer stacked on each other, and wherein a thickness of the first TiN layer is different from a thickness of the first TiSiN layer.

15. The semiconductor device of claim 14, wherein the first high dielectric constant insulating layer is in contact with the first silicon nitride layer, and the second high dielectric constant insulating layer is in contact with the second silicon nitride layer.

16. The semiconductor device of claim 14, wherein the first gate electrode structure is included in a first p-type transistor, the second gate electrode structure is included in a second p-type transistor, and wherein a threshold voltage of the first p-type transistor is different from a threshold voltage of the second p-type transistor.

17. The semiconductor device of claim 14, wherein the second conductive liner comprises a second titanium nitride (TiN) layer and a second titanium silicon nitride (TiSiN) layer stacked on the second TiN layer.

18. A semiconductor device comprising:
a first p-type transistor formed in a first region of a substrate and having a first threshold voltage; and
a second p-type transistor formed in a second region of the substrate and having a second threshold voltage less than the first threshold voltage,
wherein the first p-type transistor comprises:
first and second nanowires sequentially disposed on the substrate;
a first gate insulating layer formed along a periphery of the first nanowire and a periphery of the second nanowire; and
a first gate electrode which surrounds the first nanowire and the second nanowire on the first gate insulating layer,
wherein the first gate electrode comprises a first titanium nitride layer and a first titanium silicon nitride layer sequentially formed along the periphery of the first nanowire and the periphery of the second nanowire, and a first upper electrode on the first titanium silicon nitride layer,
wherein the second p-type transistor comprises:
third and fourth nanowires sequentially disposed on the substrate;
a second gate insulating layer formed along a periphery of the third nanowire and a periphery of the fourth nanowire; and
a second gate electrode which surrounds the third nanowire and the fourth nanowire on the second gate insulating layer,
wherein the second gate electrode comprises a second gate electrode comprising a second titanium nitride layer and a second titanium silicon nitride layer, wherein the second titanium nitride layer and the second titanium silicon nitride layer are formed along the periphery of the third nanowire and the periphery of the fourth nanowire, and
wherein a ratio of a thickness of the first titanium silicon nitride layer to a thickness of the first titanium nitride layer is in a range of about 5/3 to about 7.

19. The semiconductor device of claim 18, wherein the second titanium nitride layer is disposed on the second titanium silicon nitride layer, and
wherein a ratio of a thickness of the second titanium silicon nitride layer to a thickness of the second titanium nitride layer is in a range of about 3/37 to about 1/3.

20. The semiconductor device of claim 18, wherein the second titanium silicon nitride layer is disposed on the second titanium nitride layer,
wherein the second gate electrode comprises:
a second upper electrode disposed on the second titanium silicon nitride layer; and
a conductive insertion liner comprising aluminum (Al) formed along a side wall of the third nanowire, a side wall of the fourth nanowire and an upper surface of the fourth nanowire, and
wherein a ratio of the thickness of the second titanium silicon nitride layer to a thickness of the second titanium nitride layer is in a range of about 2/3 to about 4.

* * * * *